United States Patent
Kyle

(10) Patent No.: US 8,279,606 B2
(45) Date of Patent: Oct. 2, 2012

(54) PROCESSOR LOADING SYSTEM INCLUDING A HEAT DISSIPATER

(75) Inventor: Lawrence Alan Kyle, Salado, TX (US)

(73) Assignee: Dell Products L.P., Round Rock, TX (US)

( * ) Notice: Subject to any disclaimer, the term of this patent is extended or adjusted under 35 U.S.C. 154(b) by 217 days.

(21) Appl. No.: 12/876,530

(22) Filed: Sep. 7, 2010

(65) Prior Publication Data

US 2011/0273831 A1 Nov. 10, 2011

Related U.S. Application Data

(63) Continuation-in-part of application No. 12/775,654, filed on May 7, 2010, now Pat. No. 8,144,469.

(51) Int. Cl.
- *H05K 7/20* (2006.01)
- *F28F 7/00* (2006.01)
- *H01L 23/34* (2006.01)
- *H05K 1/00* (2006.01)

(52) U.S. Cl. ....... 361/709; 361/729; 361/715; 165/80.3; 165/185; 257/713; 174/16.3; 439/73

(58) Field of Classification Search .......... 361/704–719; 165/80.2–80.3, 185; 257/712–713, 718–719; 174/16.3; 439/73

See application file for complete search history.

(56) References Cited

U.S. PATENT DOCUMENTS

| | | | |
|---|---|---|---|
| 6,442,045 B1 * | 8/2002 | Goodwin et al. | 361/816 |
| 7,001,197 B2 | 2/2006 | Shirai et al. | |
| 7,388,751 B2 | 6/2008 | Hood et al. | |
| 7,785,126 B2 * | 8/2010 | Peng et al. | 439/331 |
| 7,876,566 B1 * | 1/2011 | Frisch et al. | 361/719 |
| 7,988,459 B2 * | 8/2011 | Ulen et al. | 439/73 |
| 8,144,469 B2 * | 3/2012 | Kyle et al. | 361/704 |
| 2004/0037042 A1 * | 2/2004 | Hockanson et al. | 361/704 |
| 2008/0124955 A1 | 5/2008 | Szu | |
| 2009/0233474 A1 | 9/2009 | Zhou et al. | |

* cited by examiner

*Primary Examiner* — Zachary M Pape

(74) *Attorney, Agent, or Firm* — Haynes and Boone, LLP

(57) ABSTRACT

A component loading system includes a board having a socket. A first base member is secured to the board through a plurality of first heat dissipater coupling posts. A first securing member is moveably coupled to the first base member. A second base member is secured to the board through a plurality of second heat dissipater coupling posts. A second securing member is moveably coupled to the second base member. A loading member is moveably coupled to the first base member and includes a pair of opposing side edges that define a width of the loading member. A heat dissipater is operable to be coupled to the plurality of first heat dissipater coupling posts and the plurality of second heat dissipater coupling posts. The loading member is operable to be secured to the board by moving the loading member adjacent the second base member, moving the first securing member into engagement with the second base member and a top surface of the loading member that extends between the side edges, and moving the second securing member into engagement with the first base member and the top surface of the loading member that extends between the side surfaces.

20 Claims, 26 Drawing Sheets

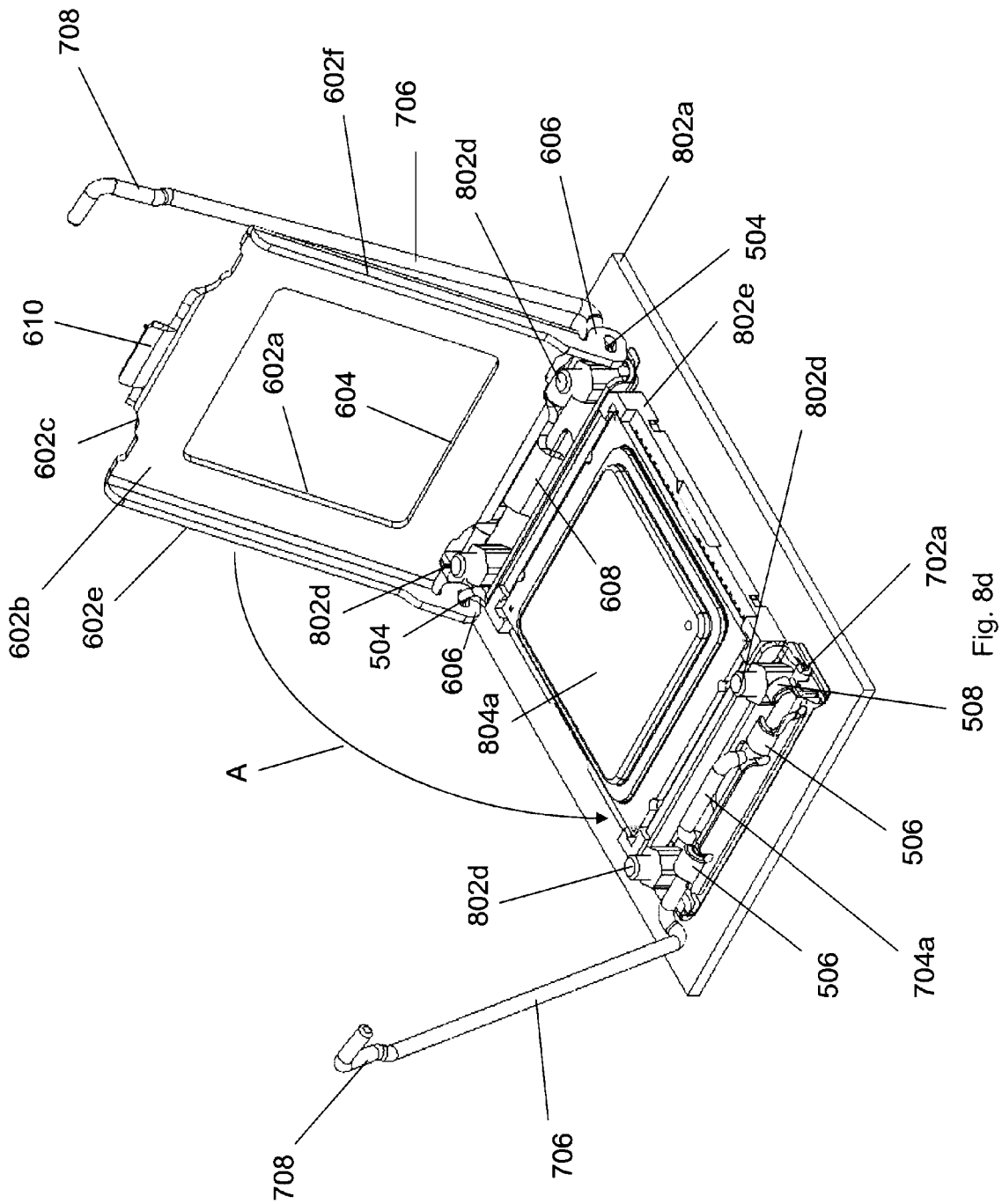

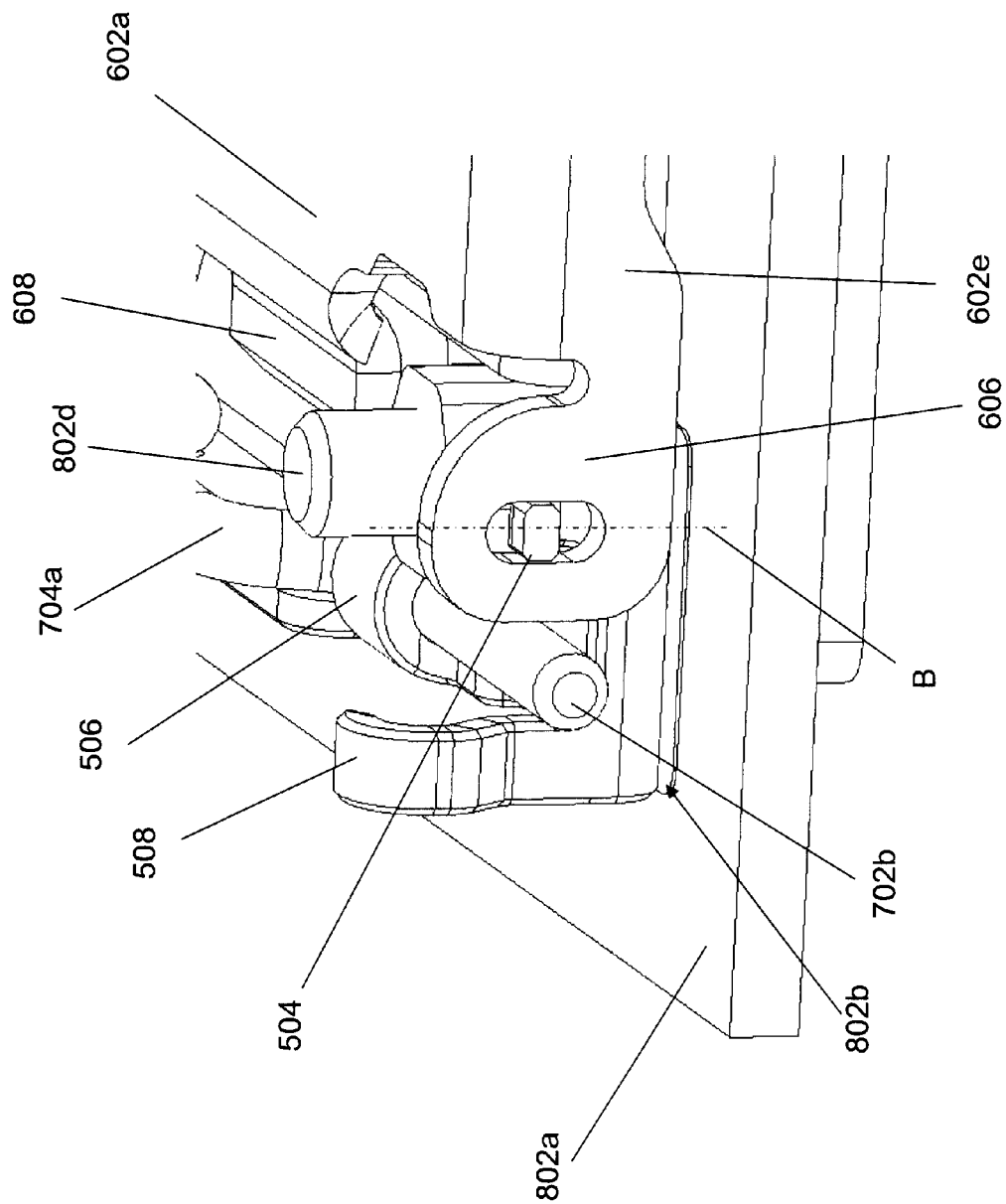

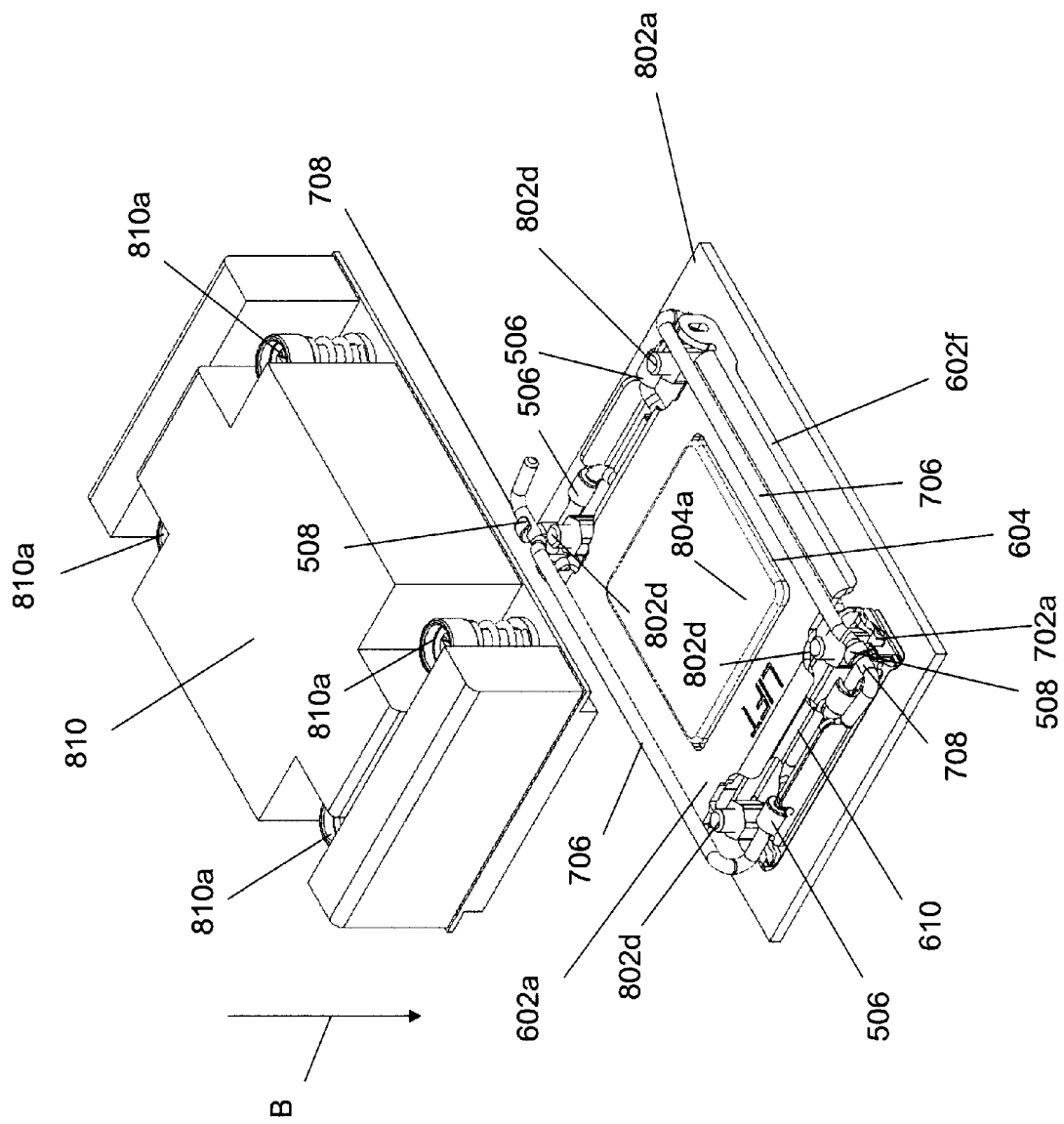

PROCESSOR LOADING SYSTEM INCLUDING A HEAT DISSIPATER

CROSS-REFERENCE TO RELATED APPLICATION

The present application is a Continuation-in-Part of co-pending U.S. patent application Ser. No. 12/775,654, filed on May 7, 2010, the disclosure of which is incorporated herein by reference.

BACKGROUND

The present disclosure relates generally to information handling systems, and more particularly to a processor loading system for an information handling system.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

IHSs include processors for use in processing, storing, and communicating information. These processors may be coupled to the IHS through a socket that is mounted to a board in the IHS. The processors typically include a plurality of pins that must be mated with the socket in order to allow the processor to function. This mating of the processor to the socket raises a number of issues.

Conventional systems and methods for mating processors with sockets include providing a board defining 4 mounting holes adjacent a socket, and then positioning 4 fasteners in a loading mechanism and the board in order to mount the loading mechanism to the board adjacent the socket. The loading mechanism also typically includes a lever that extends from the loading mechanism and over the board and is used to provide a force on the processor to mate the processor with the socket. A processor may then be placed on the socket, and the lever may be used to mate the processor with the socket. The board may also define an additional 2 to 4 mounting holes that are used to couple a heat sink or other heat dissipation device to the processor in order to cool the processor. As processors and board layouts become more complex and dense (e.g., in terms of trace routing volume), the volume and board space adjacent the socket becomes more and more valuable. By defining 6 to 8 holes in the board in order to mount the loading mechanism and heat sink, and occupying volume adjacent the socket with the lever, conventional processor loading systems use up valuable volume and board space adjacent the processor that could be utilized to, for example, route traces and/or position power components.

Accordingly, it would be desirable to provide an improved processor loading system.

SUMMARY

A component loading system includes a board including a socket, a first base member secured to the board through a plurality of first heat dissipater coupling posts, wherein a first securing member is moveably coupled to the first base member, a second base member secured to the board through a plurality of second heat dissipater coupling posts, wherein a second securing member is moveably coupled to the second base member, a loading member that is moveably coupled to the first base member and includes a pair of opposing side edges that define a width of the loading member, and a heat dissipater that is operable to be coupled to the plurality of first heat dissipater coupling posts and the plurality of second heat dissipater coupling posts, wherein the loading member is operable to be secured to the board by moving the loading member adjacent the second base member, moving the first securing member into engagement with the second base member and a top surface of the loading member that extends between the side edges, and moving the second securing member into engagement with the first base member and the top surface of the loading member that extends between the side surfaces.

BRIEF DESCRIPTION OF THE DRAWINGS

FIG. 5b is a perspective view illustrating an embodiment of the base member of FIG. 5a.

FIG. 6b is a perspective view illustrating an embodiment of the loading member of FIG. 6a.

FIG. 8d is a perspective view illustrating an embodiment of a processor positioned adjacent to the socket of FIG. 8b.

FIG. 8f is a perspective view illustrating an embodiment of the rotational coupling between the base member of FIGS. 5a and 5b and the loading member of FIGS. 6a and 6b.

FIG. 8i is a perspective view illustrating an embodiment of a heat dissipater being coupled to the processor of FIG. 8h.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
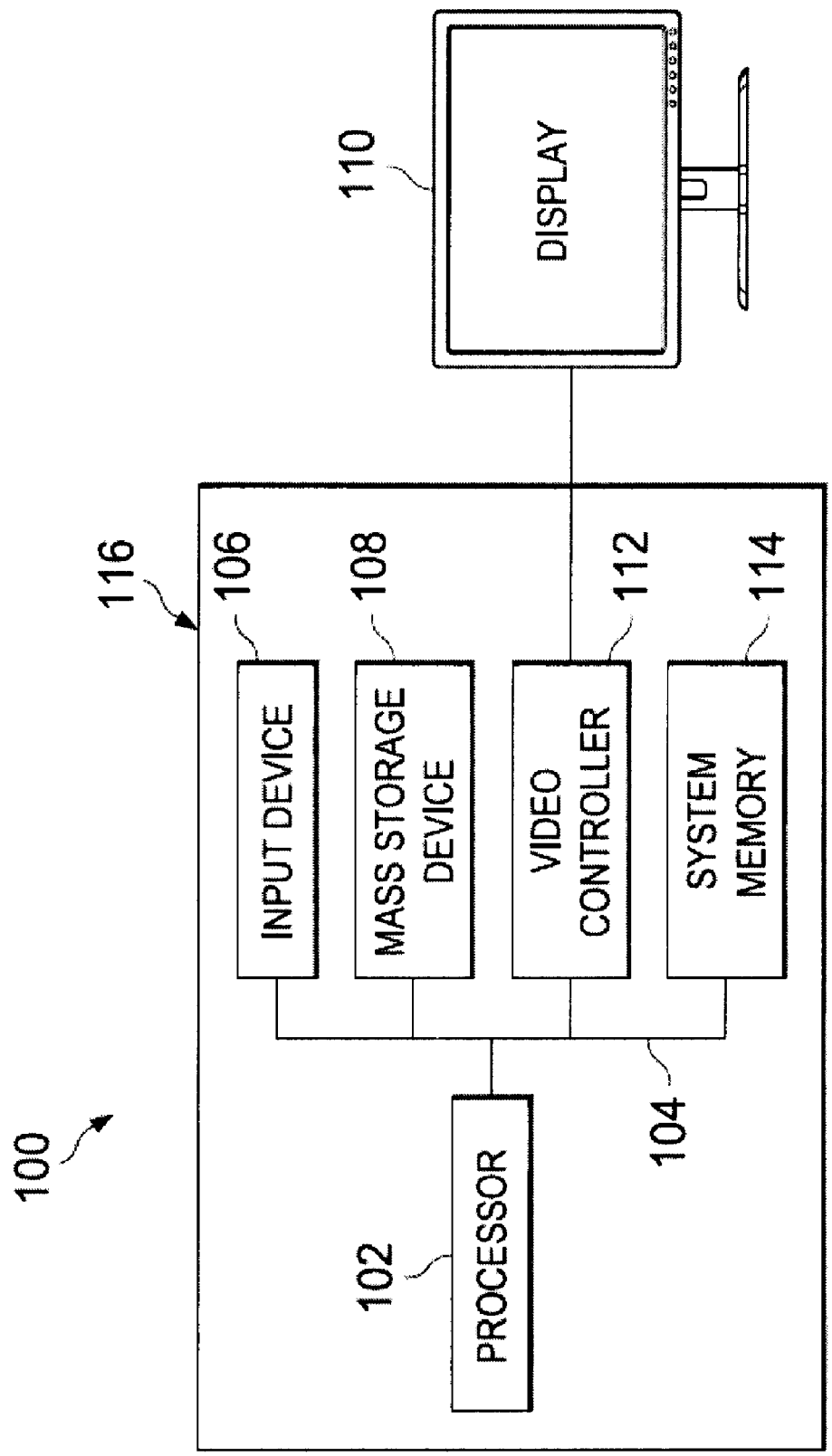
FIG. 1 is a schematic view illustrating an embodiment of an IHS.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
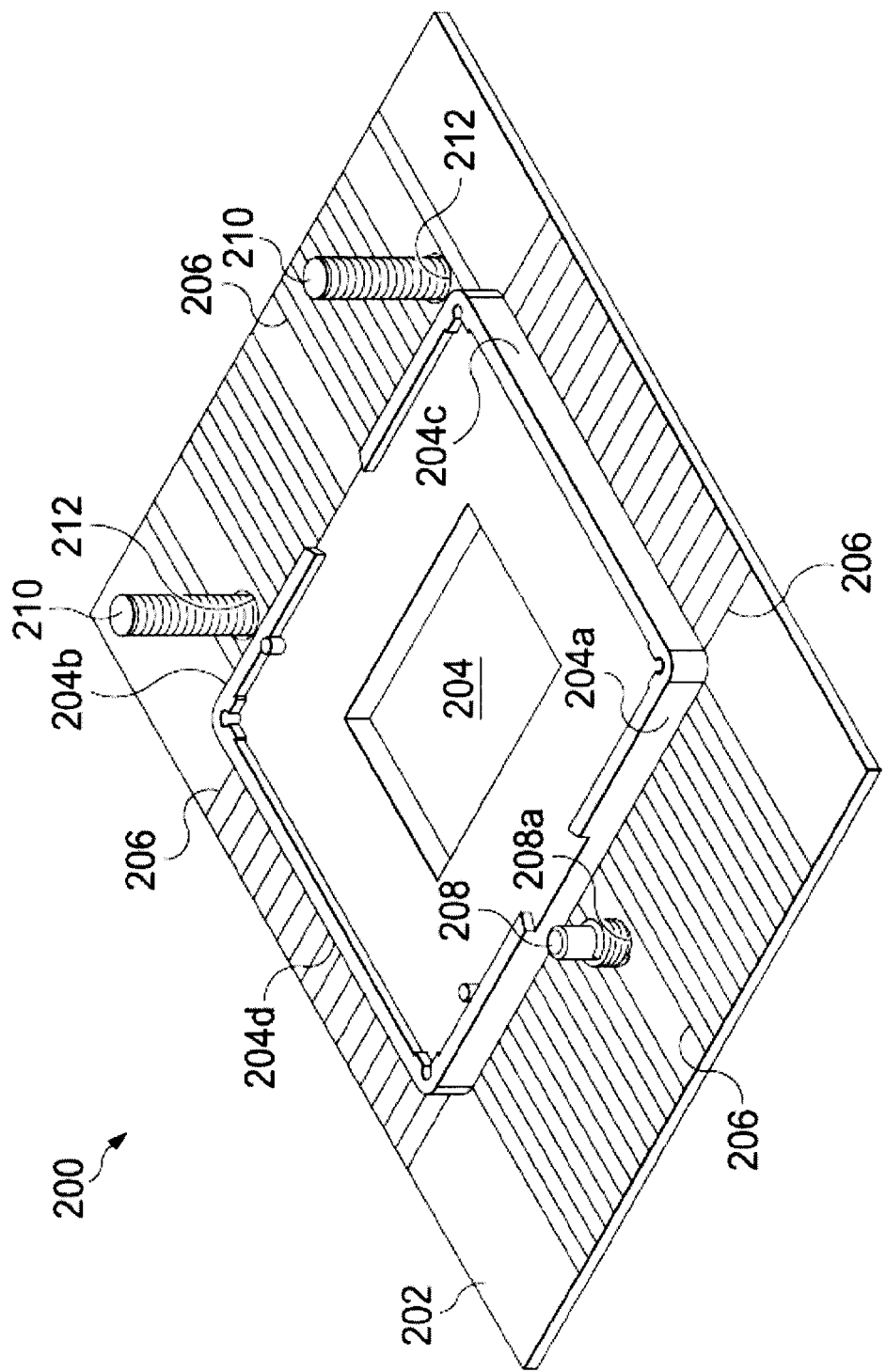
FIG. 2 is a perspective view illustrating an embodiment of a board including a socket.

Referring now to FIG. 2, a processor loading system component 200 is illustrated. In an embodiment, the processor loading system component 200 may be housed in a chassis such as, for example, the chassis 116 described above with reference to FIG. 1. In an embodiment, the processor loading system component 200 includes a board 202 that may be a Printed Circuit Board (PCB) and/or other board type known in the art. A socket 204 is mounted to the board 202 and includes a front edge 204a, a rear edge 204b located opposite the socket 204 from the front edge 204a, and a pair of opposing side edges 204c and 204d that extend between the front edge 204a and the rear edge 204b. In an embodiment, the socket 204 may be coupled to IHS components such as, for example, the memory 114, described above with reference to FIG. 1. A plurality of pins may be located on the socket 204 between the front edge 204a, the rear edge 204b, and the side edges 204c and 204d. A plurality of traces 206 are located on the board 202 and are coupled to the socket 204, the socket pins, and IHS components (e.g., the memory 114). A first mounting post 208 extends from the board 202 and located adjacent the front edge 204a of the socket 204. In an embodiment, the first mounting post 208 includes a threaded portion that is operable to couple to a threaded fastener. In an embodiment, the first mounting post 208 is coupled to the board 202 through a first mounting hole 208a defined by the board 202 adjacent the front edge 204a of the socket 204. A plurality of first heat dissipater coupling posts 210 extend from the board 202 in a spaced apart orientation from each other and adjacent the rear edge 204b of the socket 204. In an embodiment, the first heat dissipater coupling posts 210 include threaded fasteners that are coupled to the board 202 through second mounting holes 212 defined by the board 202 adjacent the rear edge 204b of the socket 204. Thus, the board 202 of the processor loading system component 200 includes only three obstructions adjacent the socket 204: either the first mounting post 208 or the first mounting hole 208a that couples the first mounting post 208 to the board 202, and either the first heat dissipater coupling posts 210 or the second mounting holes 212 that couple the first heat dissipater coupling posts 210 to the board 202.

Figure 3A:
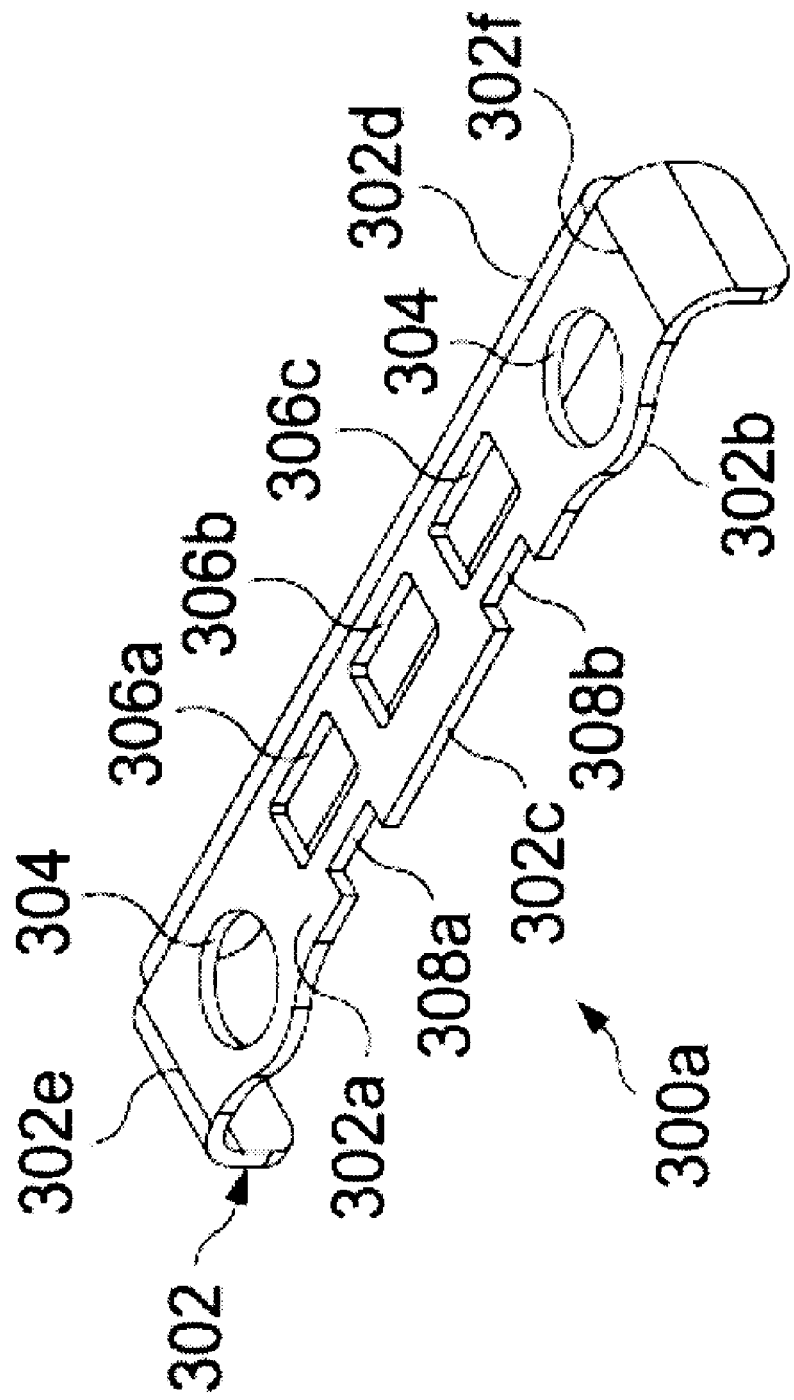
FIG. 3a is a perspective view illustrating an embodiment of a base member used with the board and socket of FIG. 2.
Figure 3B:
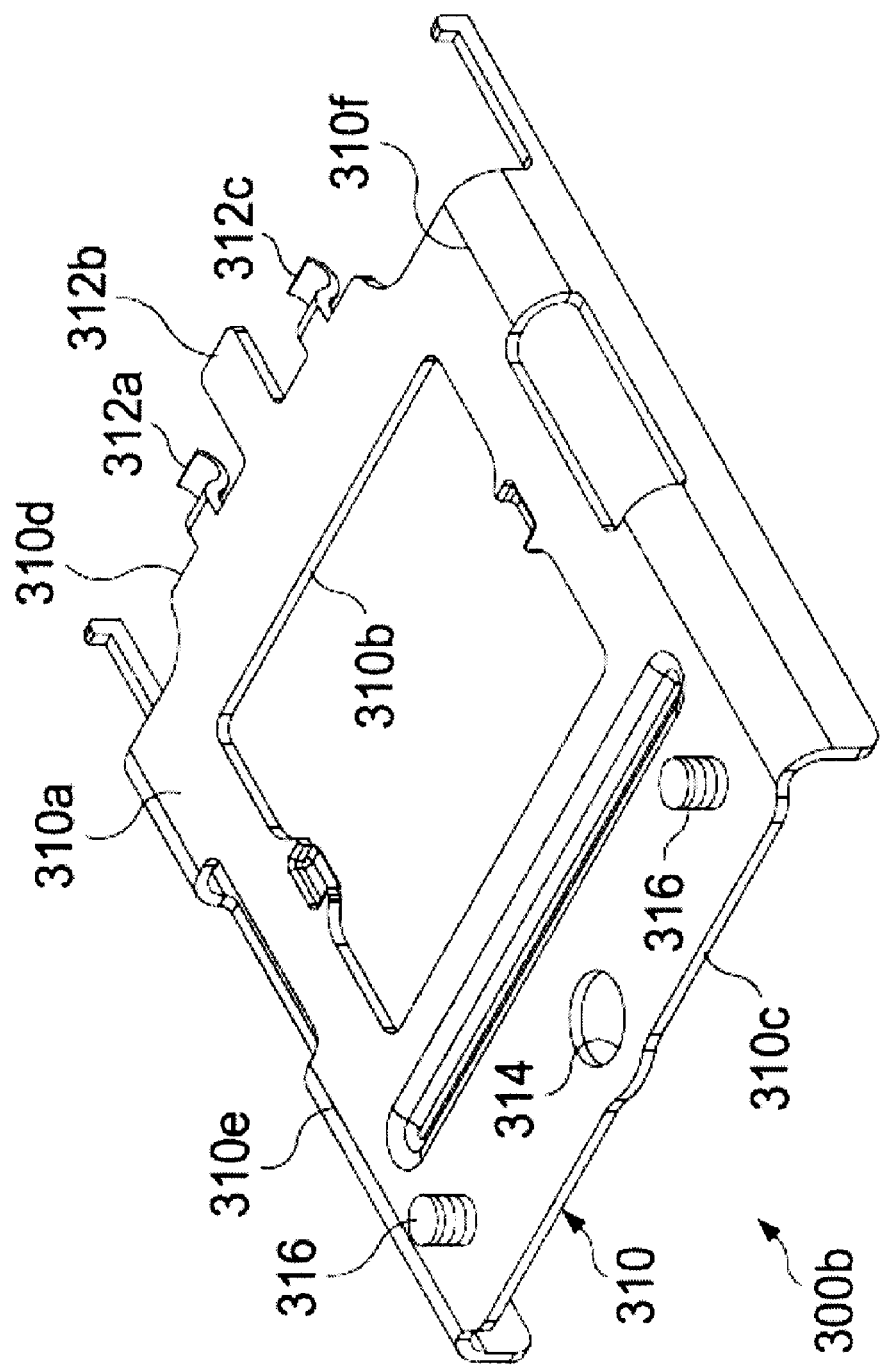
FIG. 3b is a perspective view illustrating an embodiment of a loading member used with the base member of FIG. 3a and the board and socket of FIG. 2.

Referring now to FIGS. 3a and 3b, processor loading system components 300a and 300b are illustrated. The processor loading system component 300a in FIG. 3a includes a base member 302. The base member 302 includes a top surface 302a, a bottom surface 302b located opposite the base member 302 from the top surface 302a, a front edge 302c extending between the top surface 302a and the bottom surface 302b, a rear edge 302d located opposite the front edge 302c and extending between the top surface 302a and the bottom surface 302b, and a pair of opposing side edges 302e and 302f extending between the top surface 302a, the bottom surface 302b, the front edge 302c, and the rear edge 302d. A pair of base member securing holes 304 are defined by the base member 302, extend through the base member 302 from the top surface 302a to the bottom surface 302b, and are located on the base member 302 in a spaced apart orientation from each other and adjacent the side edges 302e and 302f, respectively. Loading member coupling holes 306a, 306b and 306c are each defined by the base member 302, extend through the base member 302 from the top surface 302a to the bottom surface 302b, and are substantially centrally located on the base member 302 in a spaced apart relationship from each other and between the base member securing holes 304. A pair of loading member coupling channels 308a and 308b are defined by the base member 302, extend into the base member 302 from the front edge 302c, and are located in a spaced apart orientation from each other and adjacent the loading member coupling holes 306a and 306c, respectively.

The processor loading component 300b in FIG. 3b includes a loading member 310. The loading member 310 includes a top surface 310a, a bottom surface 310b located opposite the loading member 310 from the top surface 310a, a front edge 310c extending between the top surface 310a and the bottom surface 310b, a rear edge 310d located opposite the front edge 310c and extending between the top surface 310a and the bottom surface 310b, and a pair of opposing side edges 310e and 310f extending between the top surface 310a, the bottom surface 310b, the front edge 310c, and the rear edge 310d. A plurality of base member couplers 312a, 312b and 312c extend from a substantially central location on the rear edge 310d of the loading member 310 and in a spaced apart orientation from each other. In the illustrated embodiment, the base member coupler 312b is a substantially plane shaped while the base member couplers 312a and 312c are substantially question-mark shaped in order to provide a moveable coupling between the base member 302 and the loading member 310 (described in further detail below). The loading member 310 defines only one loading member securing hole 314 that extends through the loading member 310 from the top surface 310a to the bottom surface 310b and is located adjacent the front edge 310c in a substantially central location on the loading member 310 between the side edges 310e and 310f. A pair of second heat dissipater coupling posts 316 extend from the loading member 310 in a spaced apart orientation from each other on opposite sides of the loading member securing hole 314 and adjacent the side edges 310e and 310f, respectively. In an embodiment, the second heat dissipater coupling posts 316 include threaded fasteners.

Figure 4A:
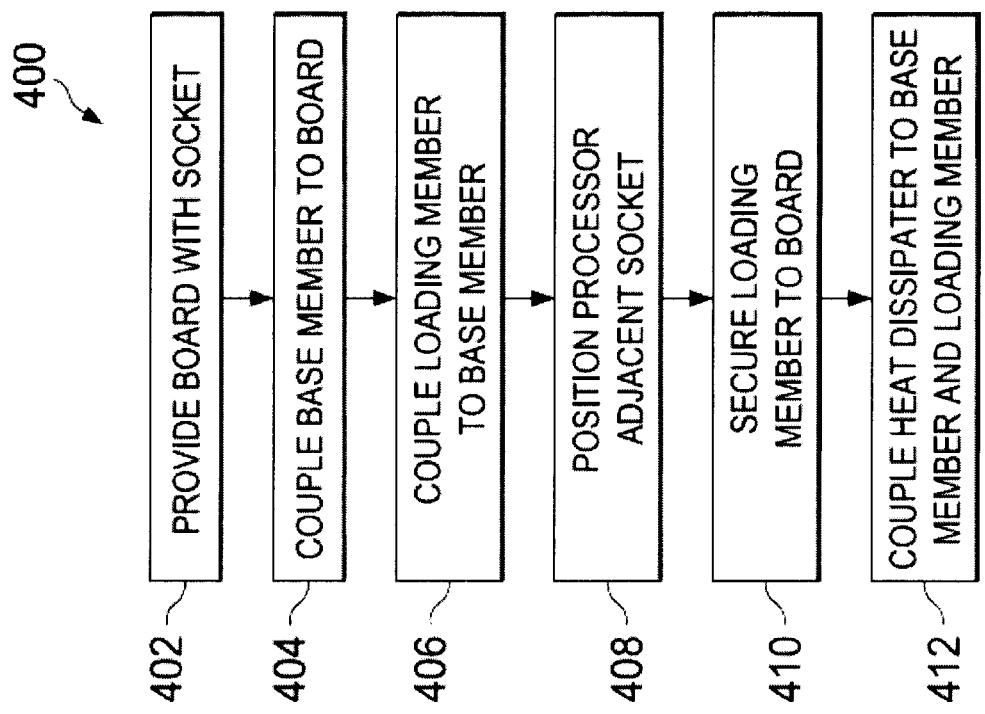
FIG. 4a is a flow chart illustrating an embodiment of a method for coupling a processor to a socket.
Figure 4B:
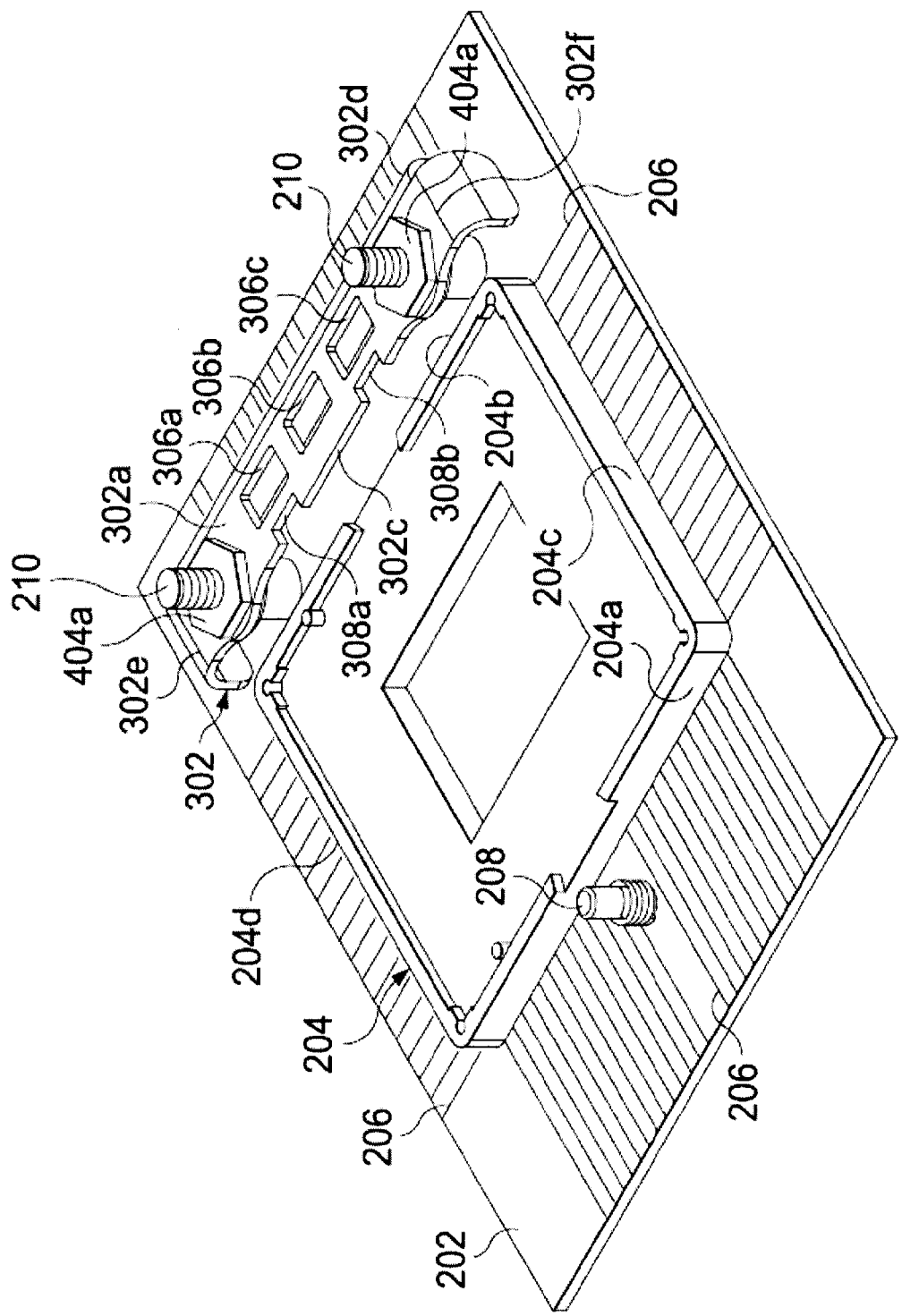
FIG. 4b is a perspective view illustrating an embodiment of the base member of FIG. 3a coupled to the board of FIG. 2.

Referring now to FIGS. 2, 3a, 4a and 4b, a method 400 for coupling a processor to a socket is illustrated. The method 400 begins at block 402 where a board with a socket is provided. In an embodiment, the processor loading system component 200 including the board 202 and the socket 204, described above with reference to FIG. 2, is provided. The method 400 then proceeds to block 404 where a base member is coupled to the board. In an embodiment, the base member 302, described above with reference to FIG. 3a, is positioned adjacent the first heat dissipater coupling posts 210 that extend from the board 202 such that the base member securing holes 304 are aligned with the first heat dissipater coupling posts 210, the bottom surface 302b of the base member 302 is facing the board 202, and the front edge 302c of the base member 302 is adjacent the socket 204. The base member 302 is then moved towards the board 202 such that the first heat dissipater coupling posts 210 extend through base member securing holes 304. In an embodiment, the base member 302 may engage the board 202 when the first heat dissipater coupling posts 210 are fully extended through the base member securing holes 304. In an embodiment, the first heat dissipater coupling posts 210 may include stops or other components that prevent the base member 302 from engaging the board 202 when the first heat dissipater coupling posts 210 are fully extended through the base member securing holes 304. Securing members such as, for example, nuts 404a, may then be coupled to the first heat dissipater coupling posts 210 in order to secure the base member 302 to the board 202, as illustrated in FIG. 4b.

Figure 4C:
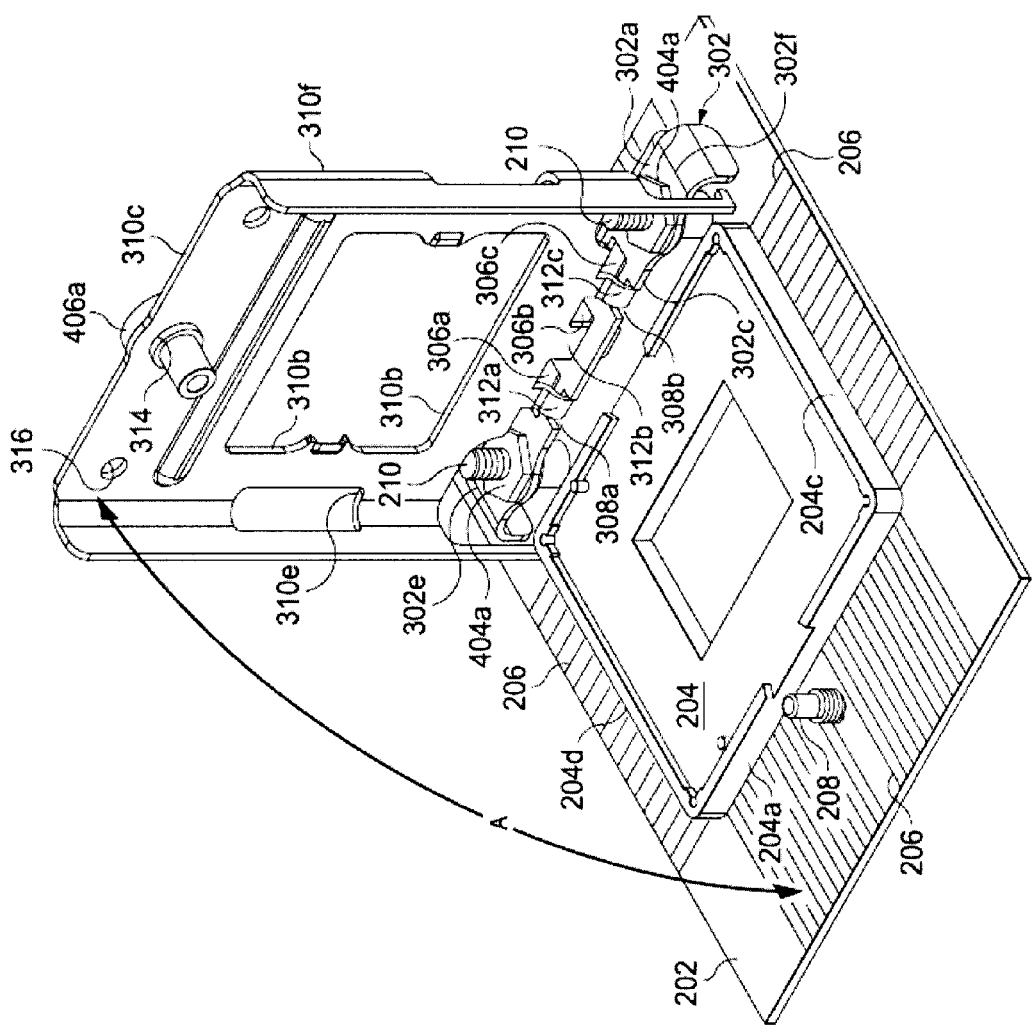
FIG. 4c is a perspective view illustrating an embodiment of the loading member of FIG. 3b coupled to the base member of FIG. 4b.
Figure 4D:
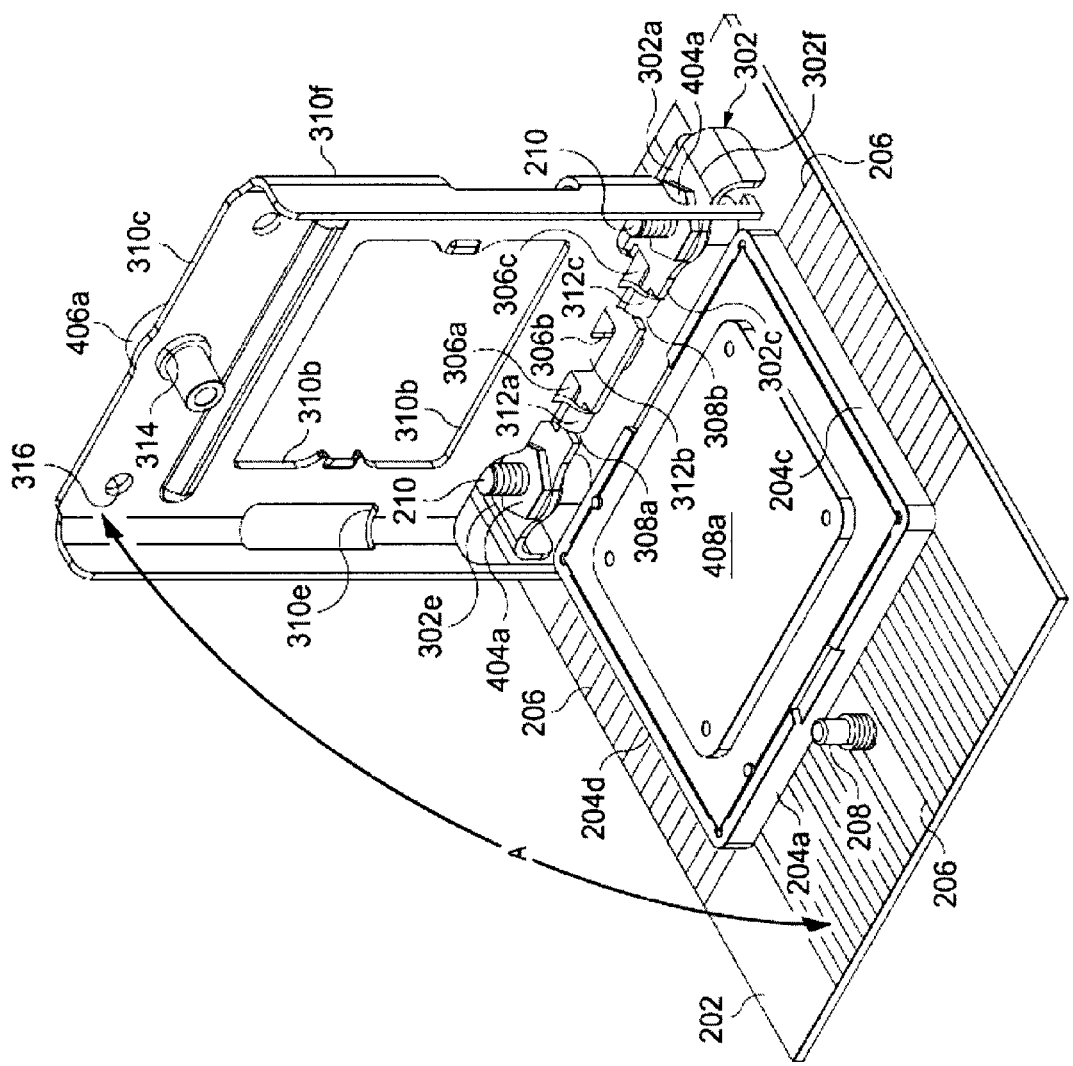
FIG. 4d is a perspective view illustrating an embodiment of a processor coupled to the socket of FIG. 4c.

Referring now to FIGS. 3b, 4a, 4c and 4d, the method 400 then proceeds to block 406 where a loading member is coupled to the base member. The loading member 310, described above with reference to FIG. 3b, is coupled to the base member 302 by positioning the base member couplers 312a and 312c in the loading member coupling channels 308a and 308b, respectively, such that the loading member 310 is oriented at an angle to the board 202 and the distal end of the base member coupler 312b is located in the loading member coupling hole 306b, as illustrated in FIG. 4c. In an embodiment, the coupling of the loading member 310 to the base member 302 is a moveable coupling that allows the loading member 310 to rotate about its coupling to the base member 302 through a range of motion A. In the illustrated embodiment, the loading member 310 includes a threaded fastener 406a that is captive to the loading member 310 through a coupling with the loading member securing hole 314. The method 400 then proceeds to block 408 where a processor is positioned adjacent the socket. A processor 408a is positioned on the socket 204 such that pins on the processor 408a (not illustrated) are aligned with pins on the socket 204 and the processor 408a sits on the socket 204, as illustrated in FIG. 4d.

Figure 4E:
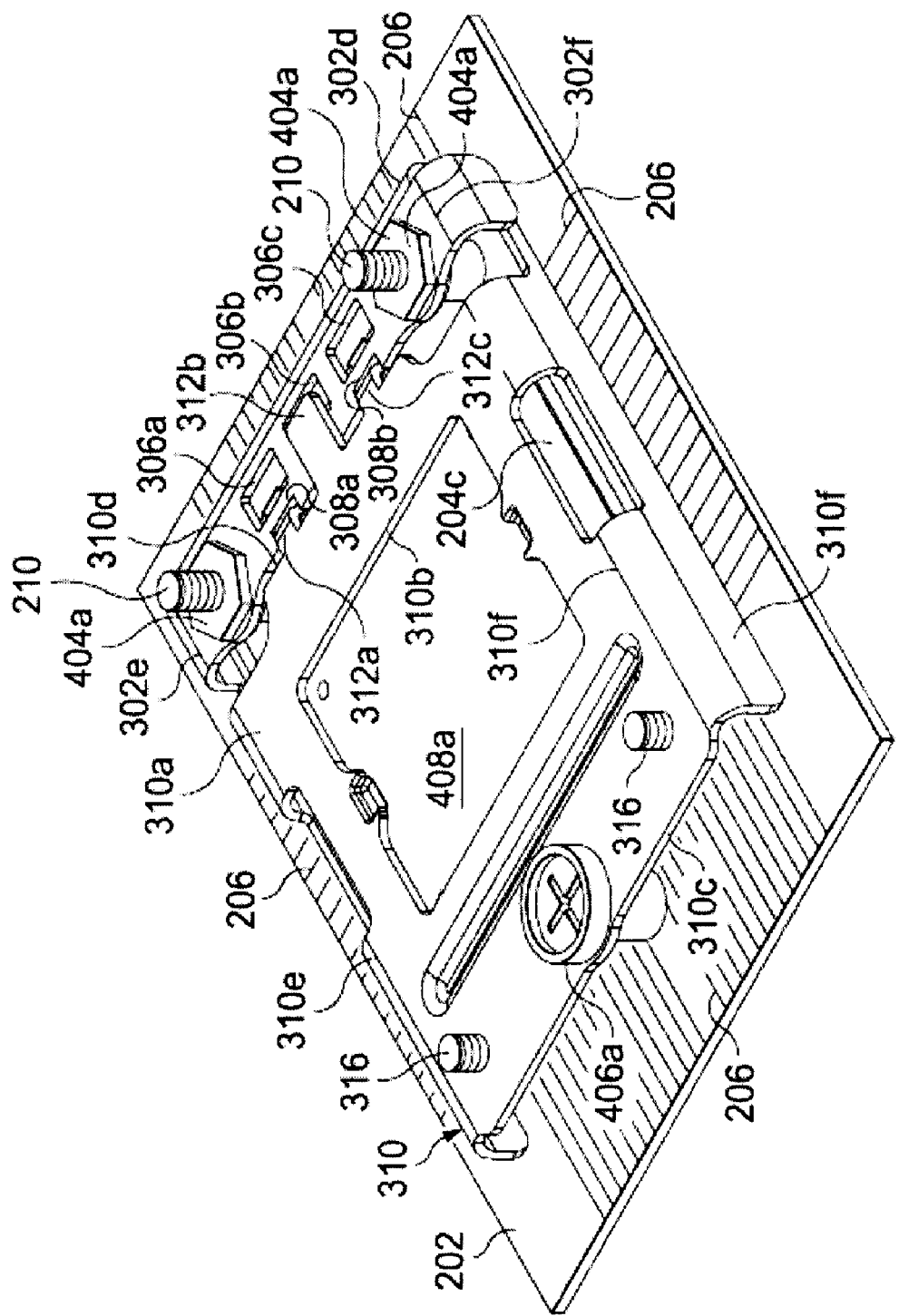
FIG. 4e is a perspective view illustrating an embodiment of the loading member of FIG. 4d rotated from the orientation illustrated in FIG. 4d and secured to the board.

Referring now to FIGS. 4a, 4d and 4e, the method 400 then proceeds to block 410 where the loading member is secured to the board. The loading member 310 is rotated through the range of motion A from the position illustrated in FIG. 4d to the position illustrated in FIG. 4e. In the position illustrated in FIG. 4e, the bottom surface 310b of the loading member 310 engages the processor 408a and the threaded fastener 406a coupled to the loading member securing hole 314 engages the first mounting post 208 that extends from the board 202. The threaded fastener 406a may then be used to secure the loading member 310 to the board 202. Securing the loading member 310 to the board 202 causes the bottom surface 310b of the loading member 310 to provide a force on the processor 408a that is sufficient to the mate the processor 408a with the socket 204.

Figure 4F:
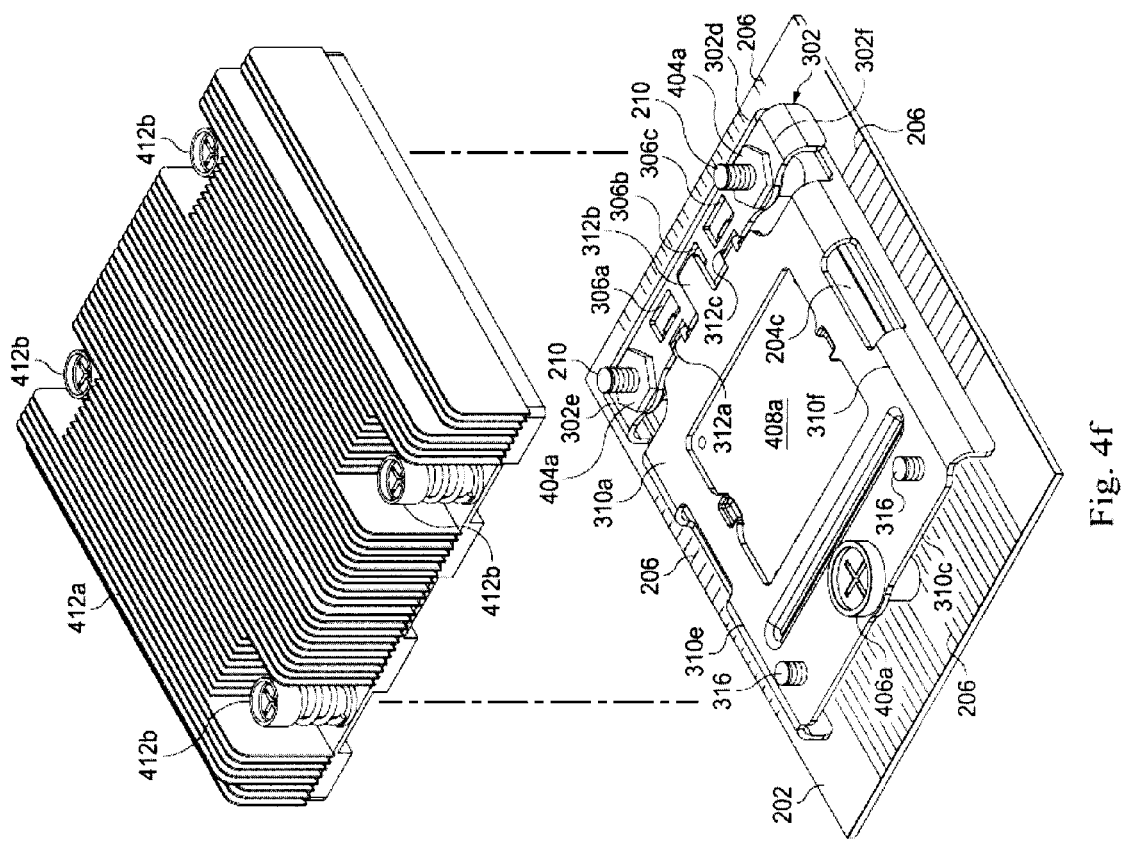
FIG. 4f is a perspective view illustrating an embodiment of a heat dissipater being coupled to the loading member and base member of FIG. 4e.
Figure 4G:
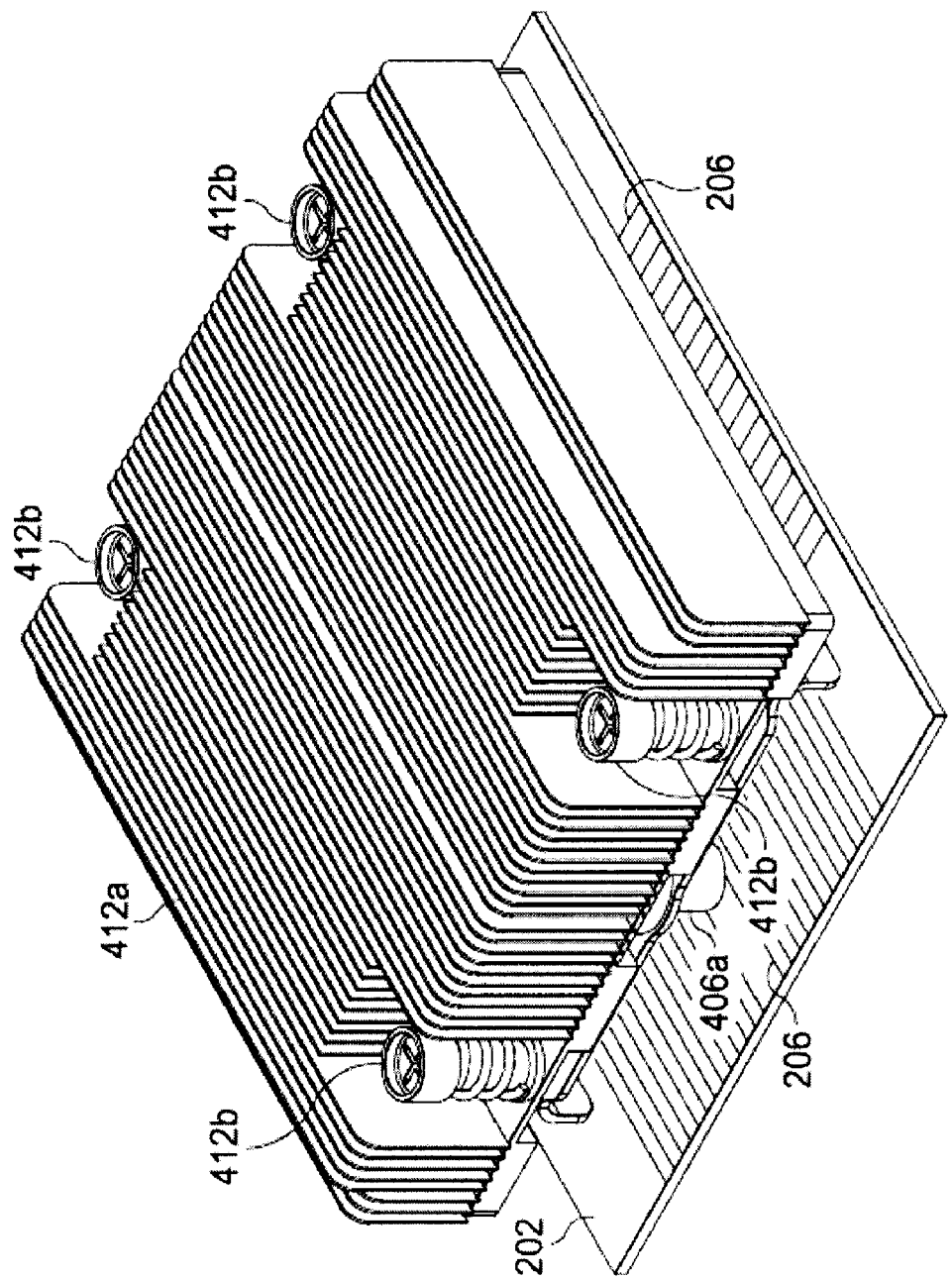
FIG. 4g is a perspective view illustrating an embodiment of the heat dissipater of FIG. 4f secured to the loading member and base member.

Referring now to FIGS. 4a, 4f and 4g, the method 400 then proceeds to block 412 where a heat dissipater is coupled to the base member and the loading member. A heat dissipater 412a (e.g., a heat sink) that includes a plurality of fasteners 412b is positioned adjacent the loading member 310 and the base member 302 such that the fasteners 412b are substantially aligned with the first heat dissipater coupling posts 210 and the second heat dissipater coupling posts 316, as illustrated in FIG. 4f. The heat dissipater 412a is then moved towards the board 202 such that the fasteners 412b engage the heat dissipater coupling posts 210 and the second heat dissipater coupling posts 316, as illustrated in FIG. 4g. The fasteners 412b may then be used to secure the heat dissipater 412a to the loading member 310a and the base member 302. With the heat dissipater 412a secured to the loading member 310 and the base member 302, the heat dissipater 412a engages the processer 406a, for example, directly or through a thermal interface material. Thus, a system and method have been described that limit the obstructions on a board adjacent a socket to a first mounting member (or first mounting hole) and a pair of first heat dissipater coupling posts (or a pair of second mounting holes). Limiting obstructions on a board adjacent a socket allow for the provision of, for example, increased trace routing density. The system and method described also provides for coupling a heat dissipater to the processor without creating any additional obstructions on the board adjacent the socket. The system and method described also eliminate a convention lever that extends into the volume adjacent the socket and is used for providing a force to mate the processor with the socket. Eliminating such levers allows power components such as, for example, voltage regulators, to be positioned closer to the socket (e.g., immediately adjacent the socket) than is possible with conventional processor loading systems in order to improve power delivery efficiency.

Figure 5A:
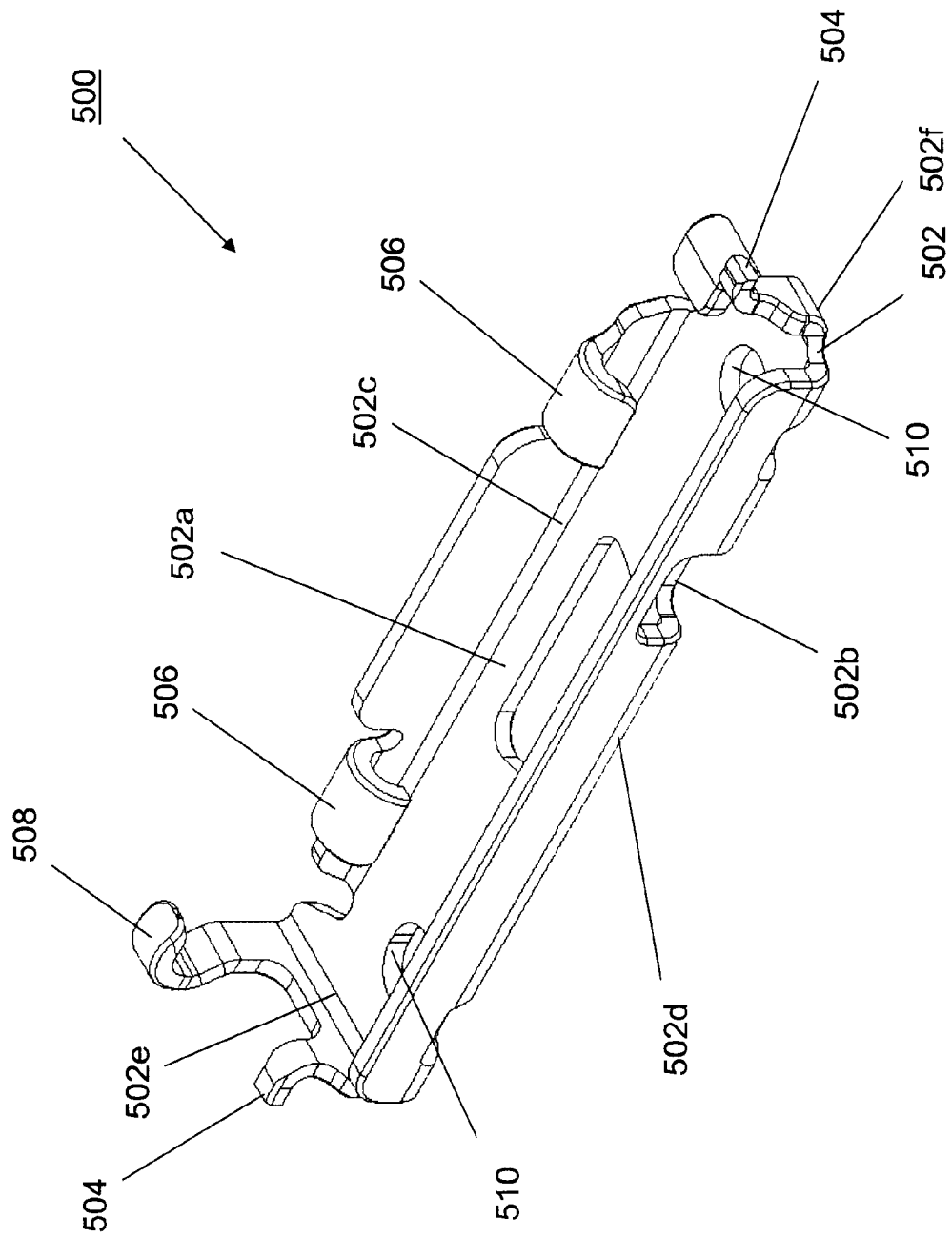
FIG. 5a is a perspective view illustrating an embodiment of a base member.
Figure 5B:
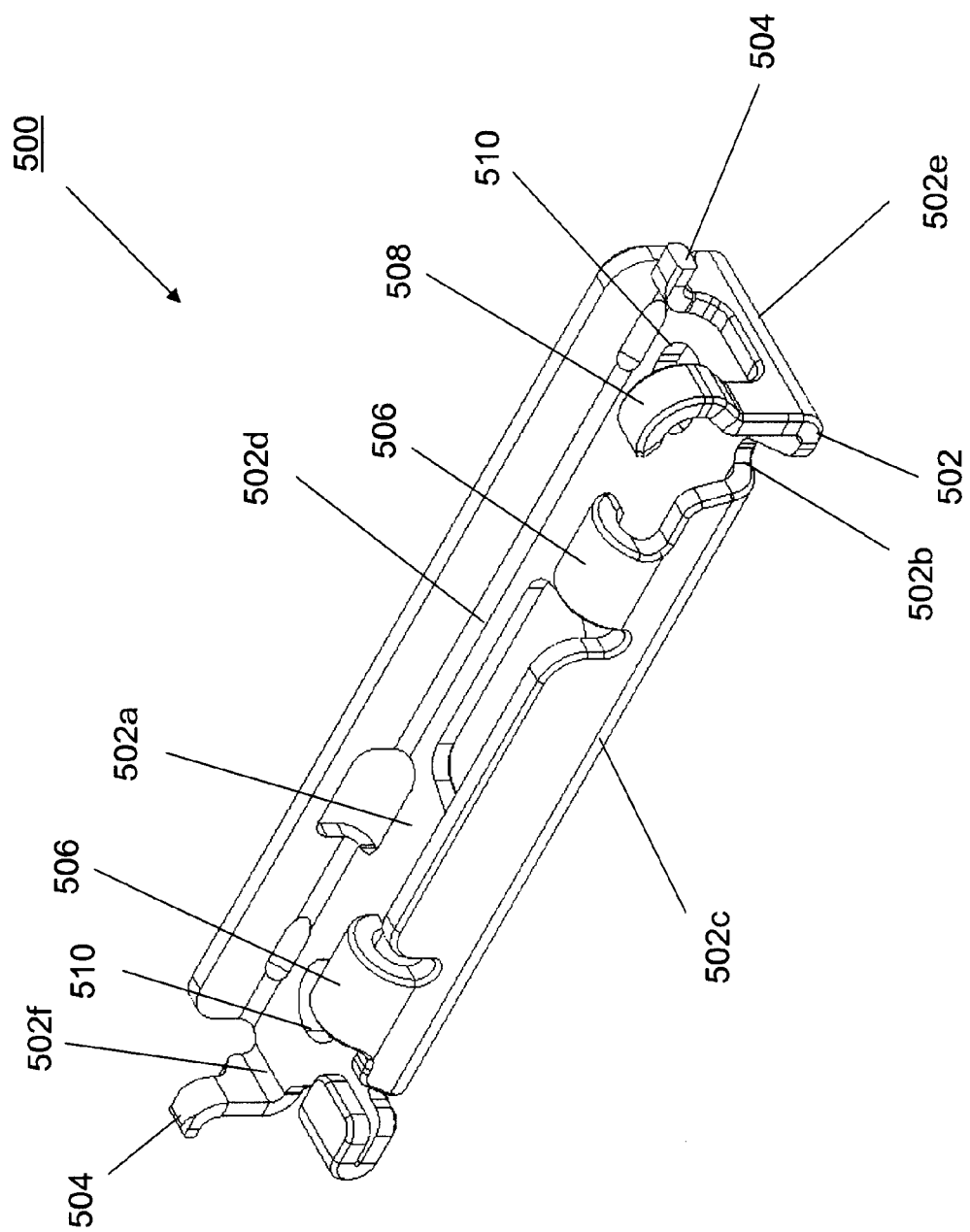

Referring now to FIGS. 5a and 5b, a processor loading system component 500 is illustrated. The processor loading system component 500 includes a base member 502 having a top surface 502a, a bottom surface 502b located opposite the top surface 502a, a front edge 502c extending between the top surface 502a and the bottom surface 502b, a rear edge 502d located opposite the base member 502 from the front edge 502c and extending between the top surface 502a and the bottom surface 502b, and a pair of opposing side edges 502e and 502f that extend between the top surface 502a, the bottom surface 502b, the front surface 502c, and the rear surface 502d. A pair of rotational coupling members 504 are included on the base member 502, with a rotational coupling member 504 extending from each of the side edges 502e and 502f of the base member 502 and away from the base member 502. A pair of securing member couplers 506 extend from the front edge 502c of the base member 502. A securing member retainer 508 extends from the side edge 502e adjacent the rotational coupling member 504. A pair of heat dissipater coupling post apertures 510 are defined by the base member 502, extend through the base member 502 from the top surface 502a to the bottom surface 502b, and are located on opposing sides of the base member 502 adjacent the side edges 502e and 502f, respectively.

Figure 6A:
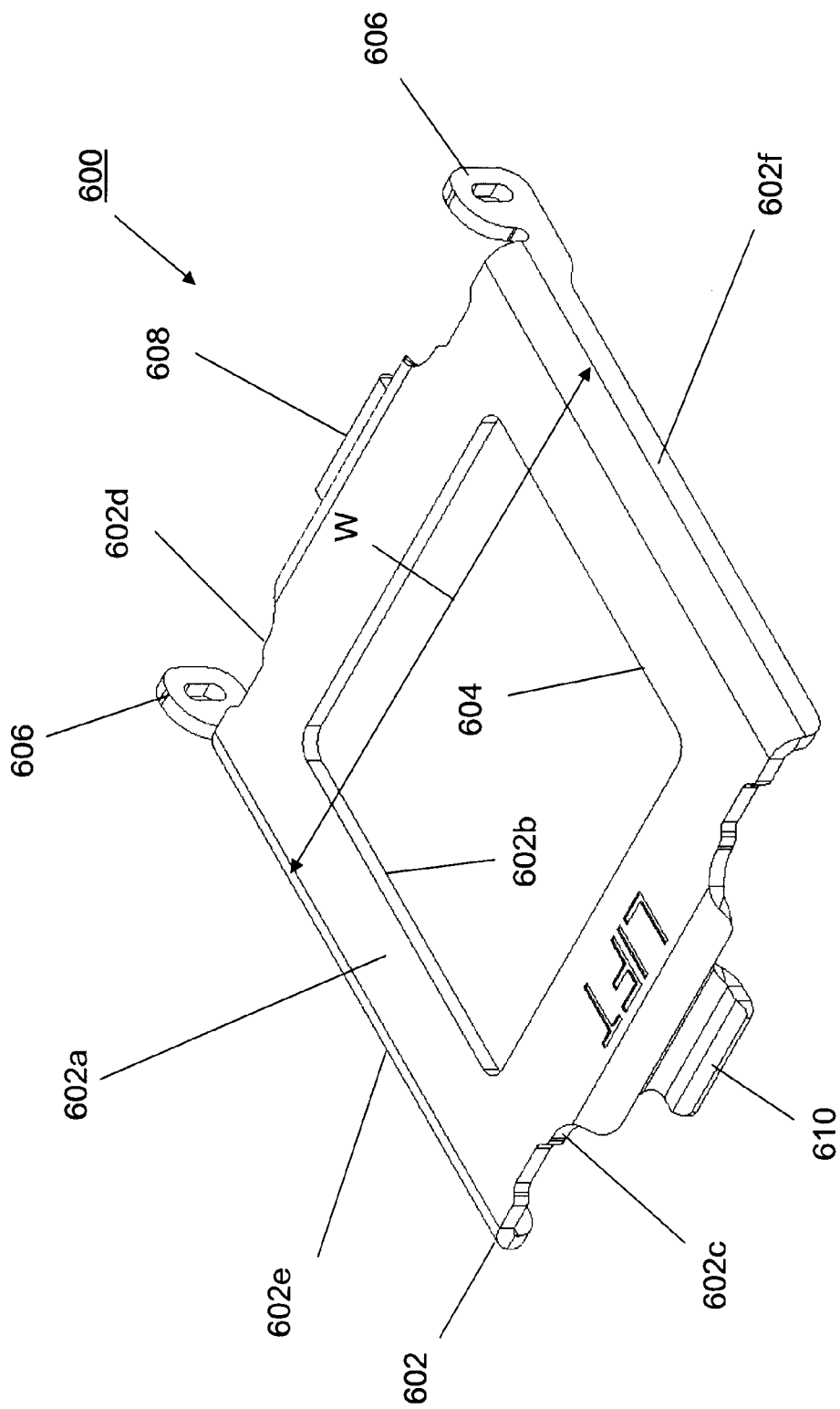
FIG. 6a is a perspective view illustrating an embodiment of a loading member used with the base member of FIGS. 5a and 5b.
Figure 6B:
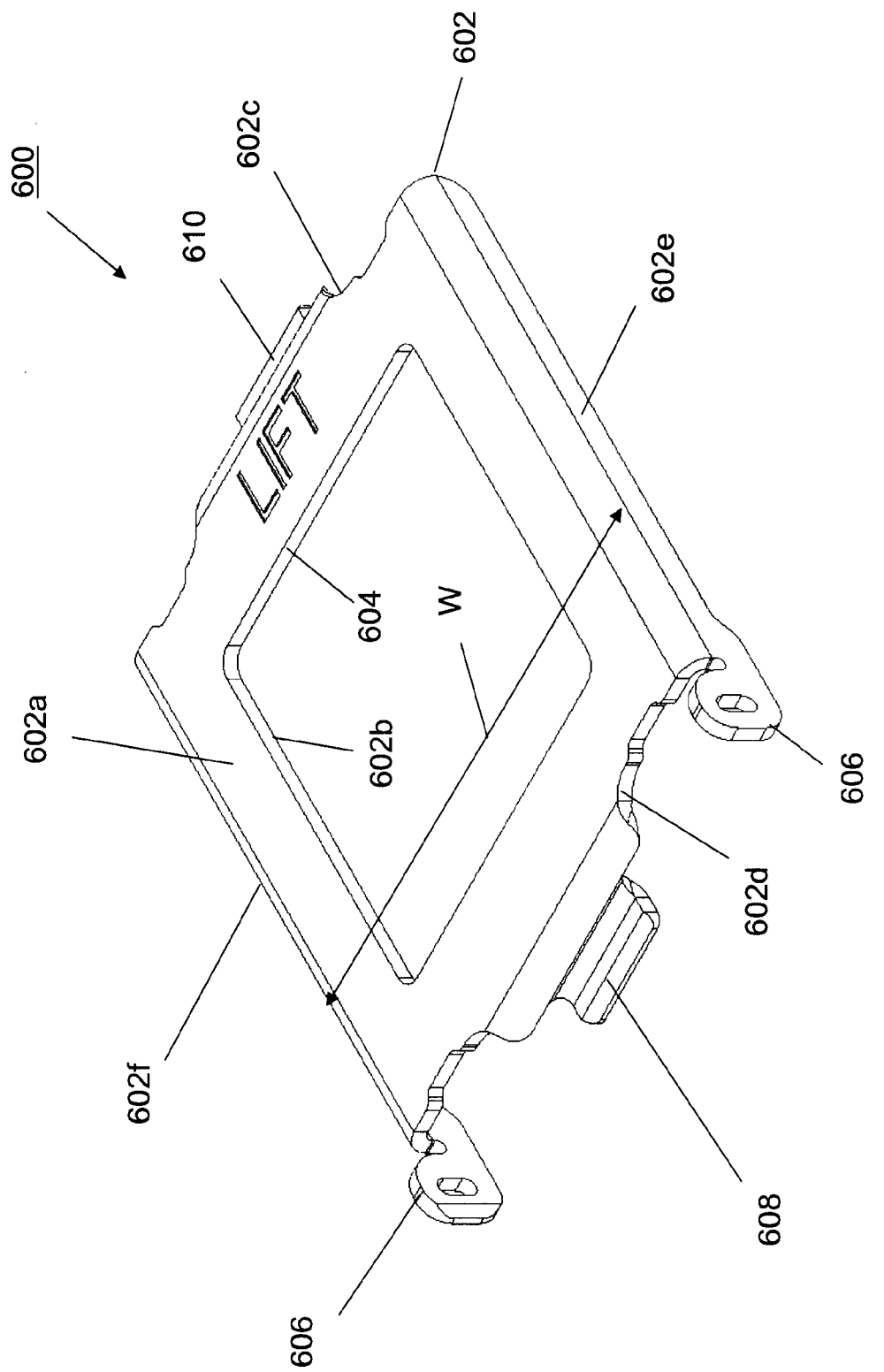

Referring now to FIGS. 6a and 6b, a processor loading system component 600 is illustrated. The processor loading system component 600 includes a loading member 602 having a top surface 602a, a bottom surface 602b located opposite the top surface 602a, a front edge 602c extending between the top surface 602a and the bottom surface 602b, a rear edge 602d located opposite the base member 602 from the front edge 602c and extending between the top surface 602a and the bottom surface 602b, and a pair of opposing side edges 602e and 602f that extend between the top surface 602a, the bottom surface 602b, the front surface 602c, and the rear surface 602d. The side edges 602e and 602f define a width W of the loading member 602. A component aperture 604 is defined by the loading member 602 and extends through the loading member 604 from the top surface 602a to the bottom surface 602b. A pair of rotational coupling members 606 extend from the rear edge 602d of the loading member 602 in a spaced apart orientation such that one rotational coupling member 606 is adjacent the side edge 602e and one rotational coupling member 606 is adjacent the side edge 602f. A secondary securing member 608 extends from the rear edge 602d of the loading member 602 between the pair of rotational coupling members 606. A secondary securing member 610 extends from a substantially central location on the front edge 602c of the loading member 602.

Figure 7:
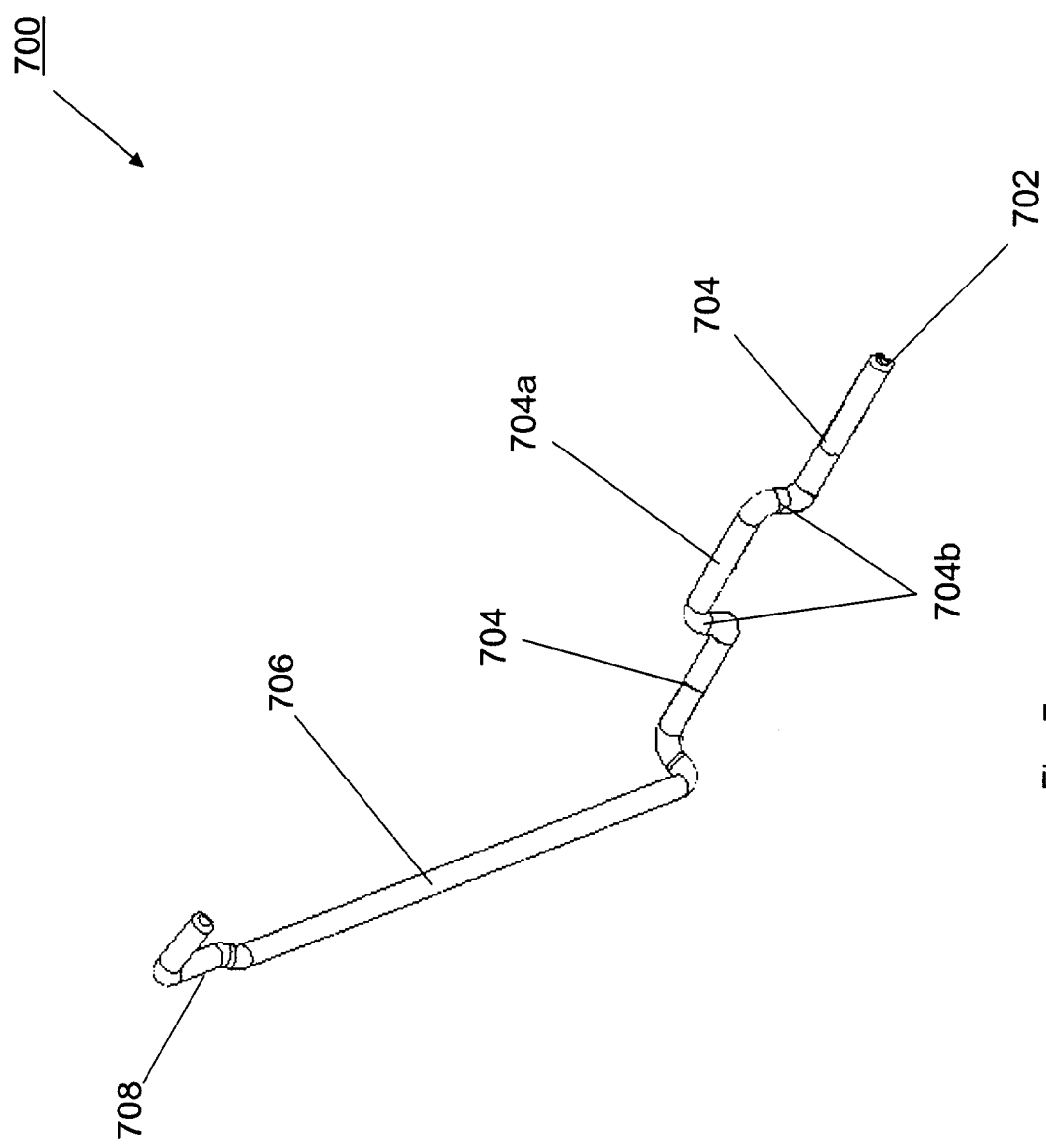
FIG. 7 is a perspective view illustrating an embodiment of a securing member used with the base member of FIGS. 5a and 5b and the loading member of FIGS. 6a and 6b.

Referring now to FIG. 7, a processor loading system component 700 is illustrated. The processor loading system component 700 includes a securing member 702 having a beam 704 that includes a secondary securing portion 704a that extends from the beam 704 from a pair of extensions 704b that are substantially perpendicular to the beam 704 such that the secondary securing portion 704a is substantially parallel to the beam 704. A primary securing portion 706 of the securing member 702 extends from the beam 704 in a substantially perpendicular orientation to the beam 704. A securing feature 708 is located on a distal end of the primary securing portion 706 that is opposite the beam 704.

Referring now to FIGS. 5a, 5b, 6a, 6b, 7, 8a, and 8b, a method 800 for coupling a processor to a socket is illustrated. The method 800 begins at block 802 where a board with a socket and processor loading system is provided. A board 802a which may be, for example, a circuit board and/or other board known in the art, is provided. In an embodiment, the board 802a may be housed in a chassis such as the chassis 116 described above with reference to FIG. 1, and may be coupled to some or all of the IHS components. A pair of base members 502 are coupled to the board 802a in a spaced apart orientation from each other such that a first base member 802b and a second base member 802c are provided. In an embodiment, the first base member 802b and the second base member 802c may be substantially similar to each other in structure and dimension such that only a single base member 500 need be manufactured for use in the processor loading system. The first base member 802b and the second base member 802c are each secured to the board 802a through a pair of heat dissipater coupling posts 802d that extend through the heat dissipater coupling post apertures 510 and the board 802a. As illustrated, the heat dissipater coupling posts 802d may include nuts or other components to secure the first base member 802b and the second base member 802c to the board 802a. A socket 802e is mounted to the board 802 between the first base member 802b and the second base member 802c. In an embodiment, the socket 802e is electrically coupled to the board 802a and, through the board 802a, to IHS components such as the IHS components described above with reference to FIG. 1. The loading member 602 is coupled to the first base member 802b by engaging the rotational coupling members 504 on the first base member 802b with respective rotational coupling members 606 on the loading member 602, as illustrated in FIG. 8c. A first securing member 802f, which may be the securing member 700 described above with reference to FIG. 7, is coupled to the first base member 802b by engaging the beam 704 on the first securing member 802f with the securing member couplers 506 on the first base member 802b such that the secondary securing portion 704a is located between the securing member couplers 506. A second securing member 802g, which may be the securing member 700 described above with reference to FIG. 7, is coupled to the second base member 802c by engaging the beam 704 on the second securing member 802g with the securing member couplers 506 on the second base member 802c such that the secondary securing portion 704a is located between the securing member couplers 506.

Figure 8A:
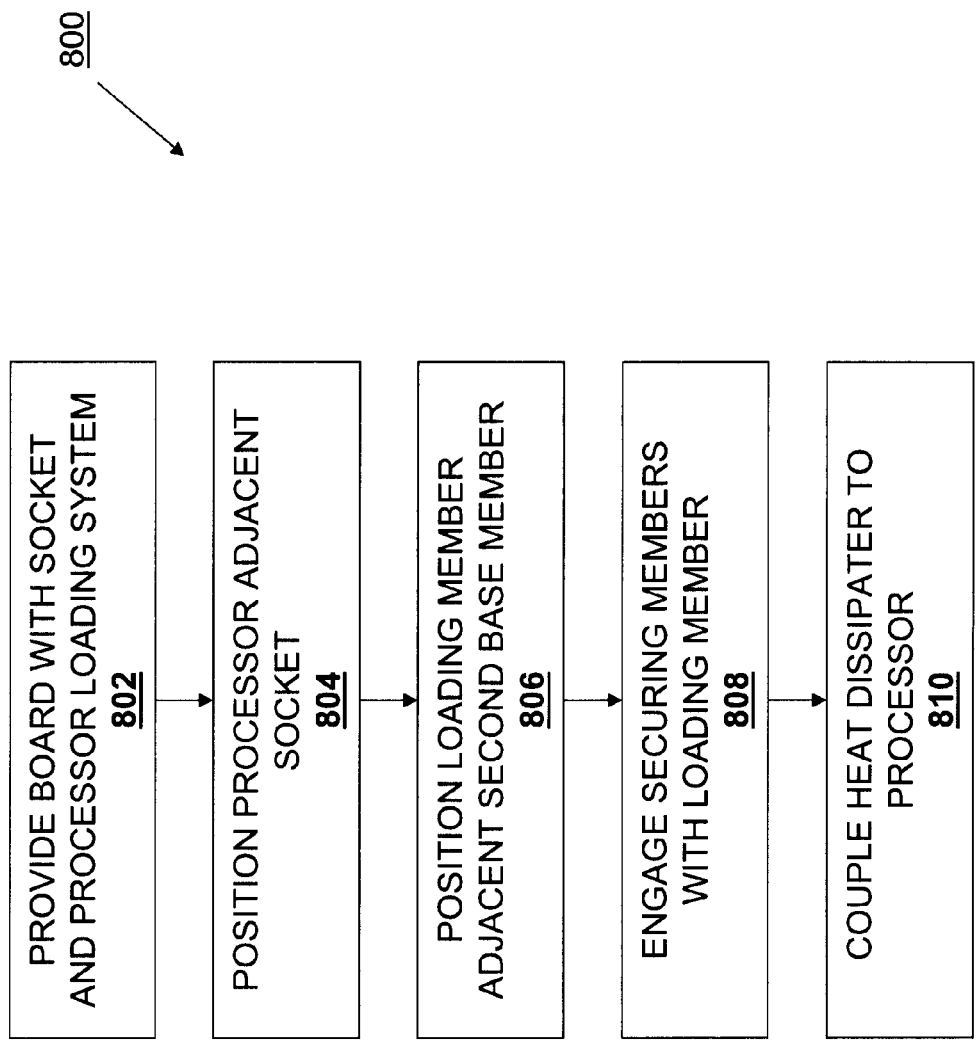
FIG. 8a is a flow chart illustrating an embodiment of a method for coupling a processor to a socket.
Figure 8B:
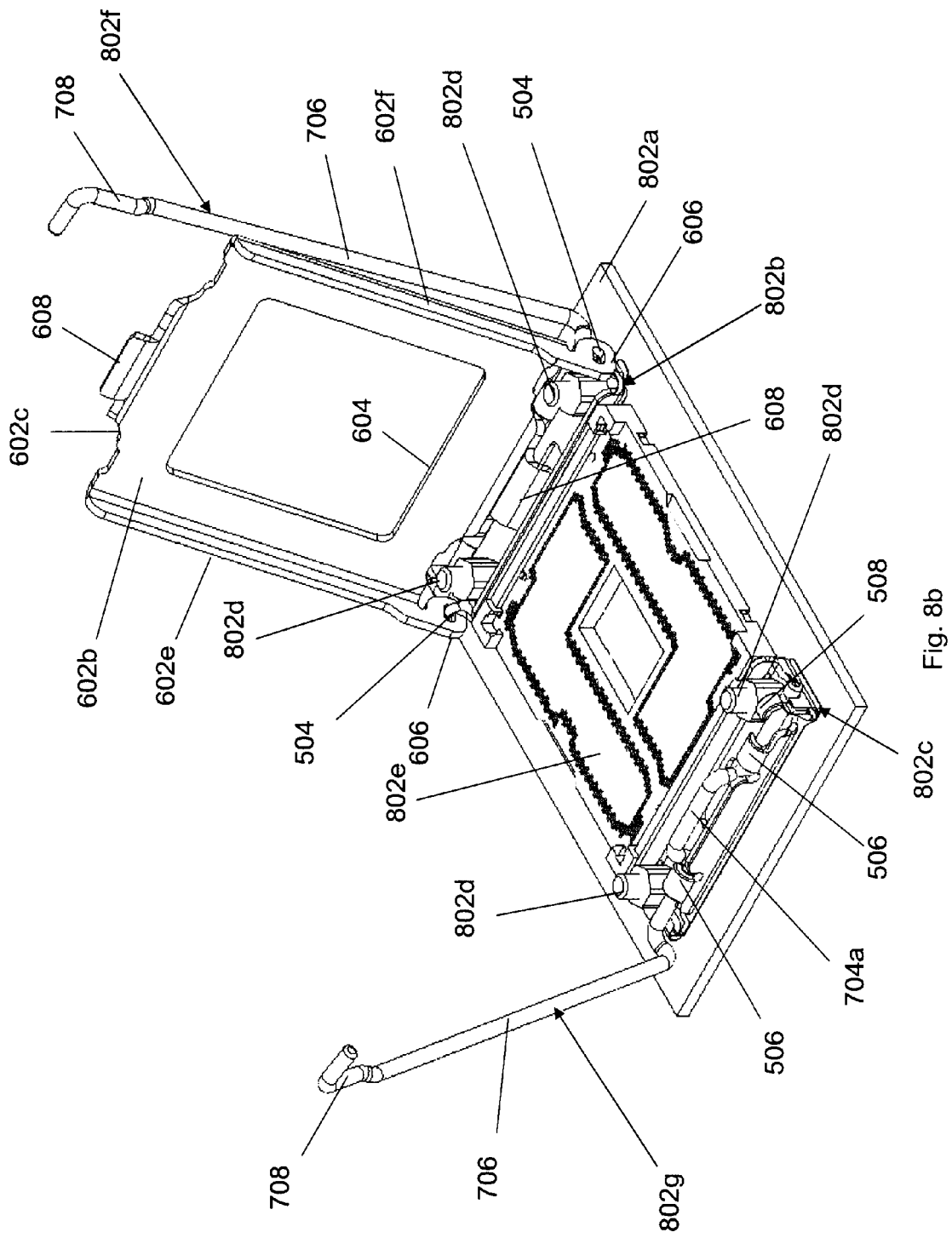
FIG. 8b is a perspective view illustrating an embodiment of a board with a socket, a pair of the base members of FIGS. 5a and 5b, the loading member of FIGS. 6a and 6b, and a pair of the securing members of FIG. 7.
Figure 8C:
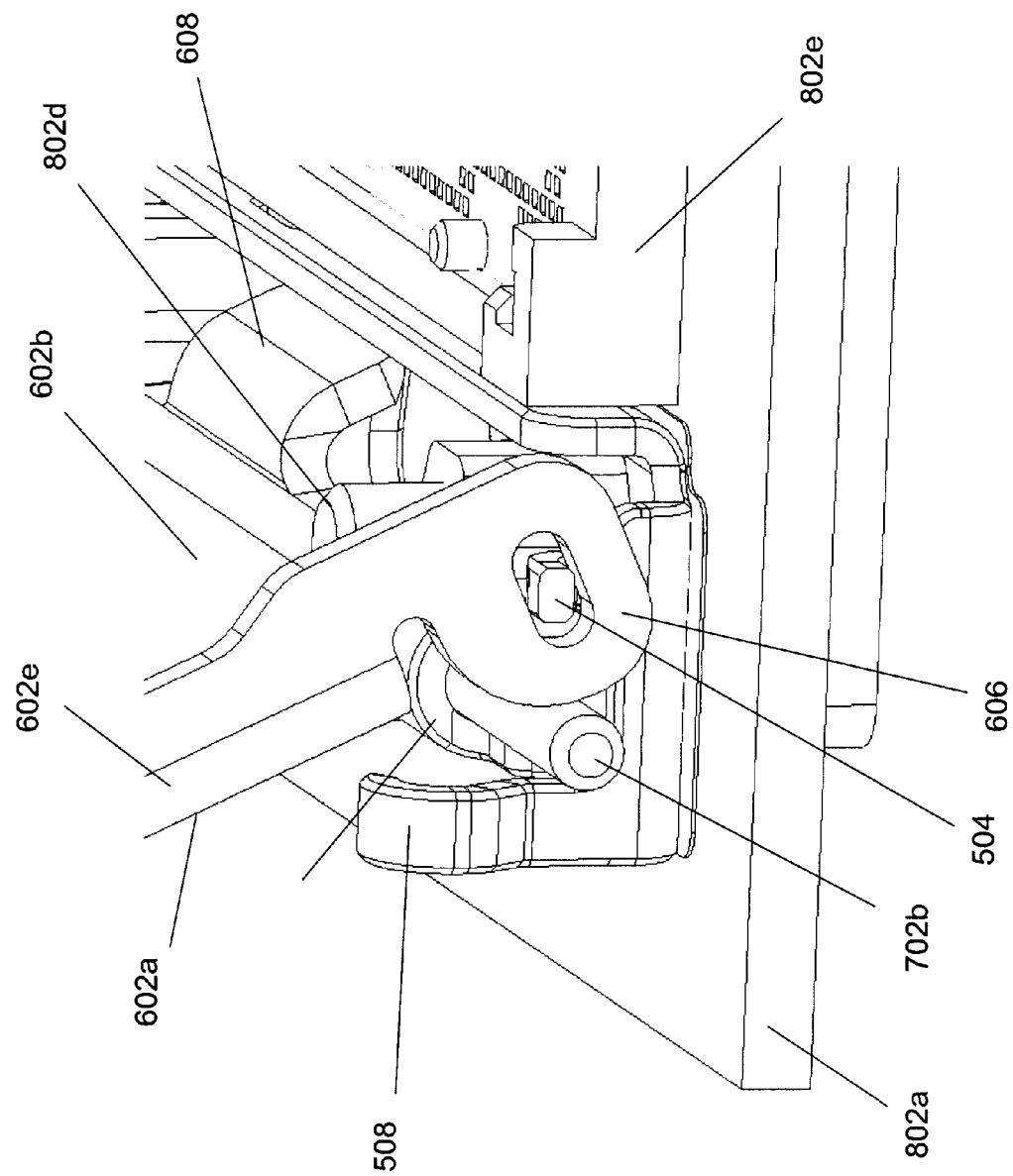
FIG. 8c is a perspective view illustrating an embodiment of the rotational coupling between the base member of FIGS. 5a and 5b and the loading member of FIGS. 6a and 6b.
Figure 8E:
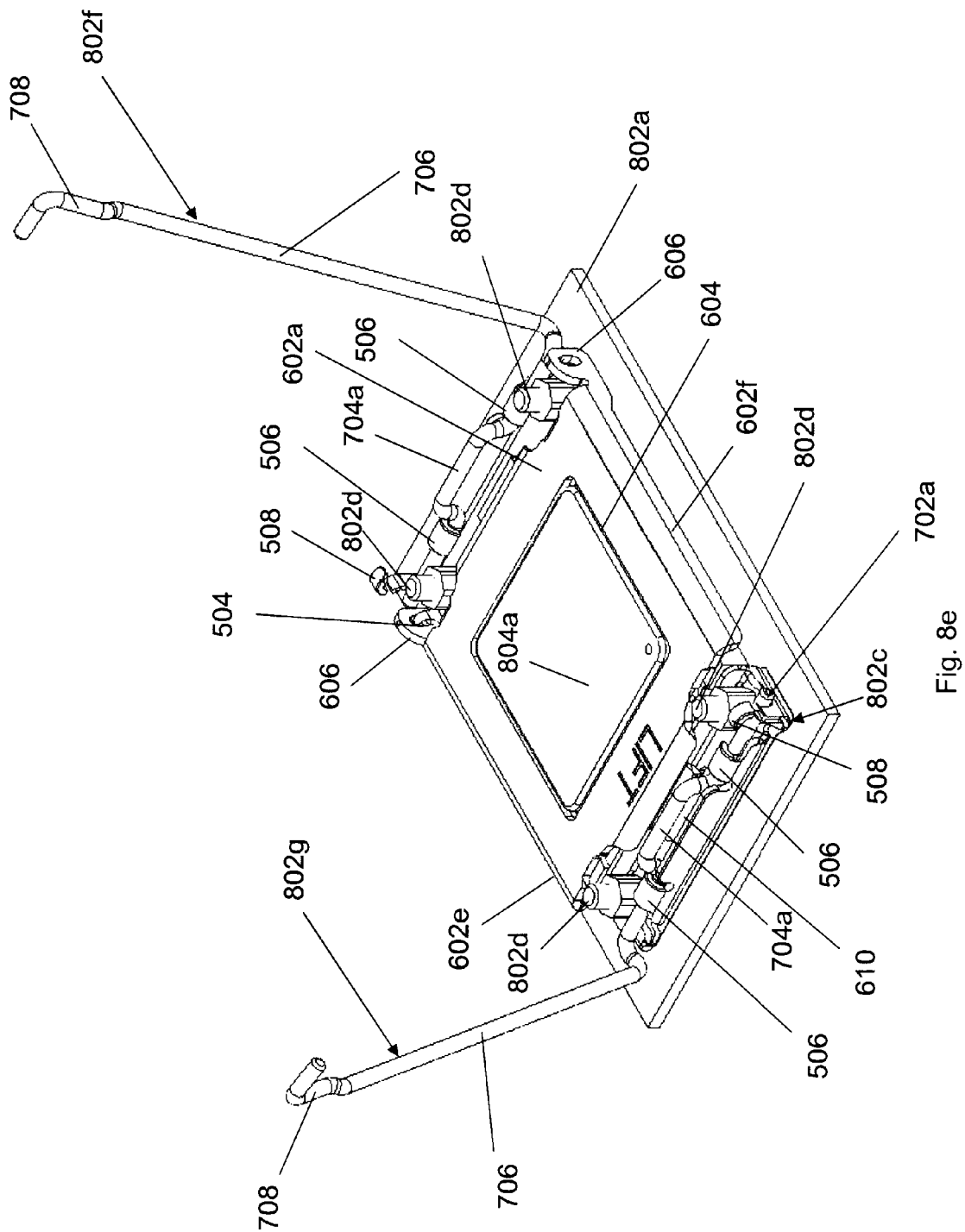
FIG. 8e is a perspective view illustrating an embodiment of the processor of FIG. 8d being mated with the socket.
Figure 8G:
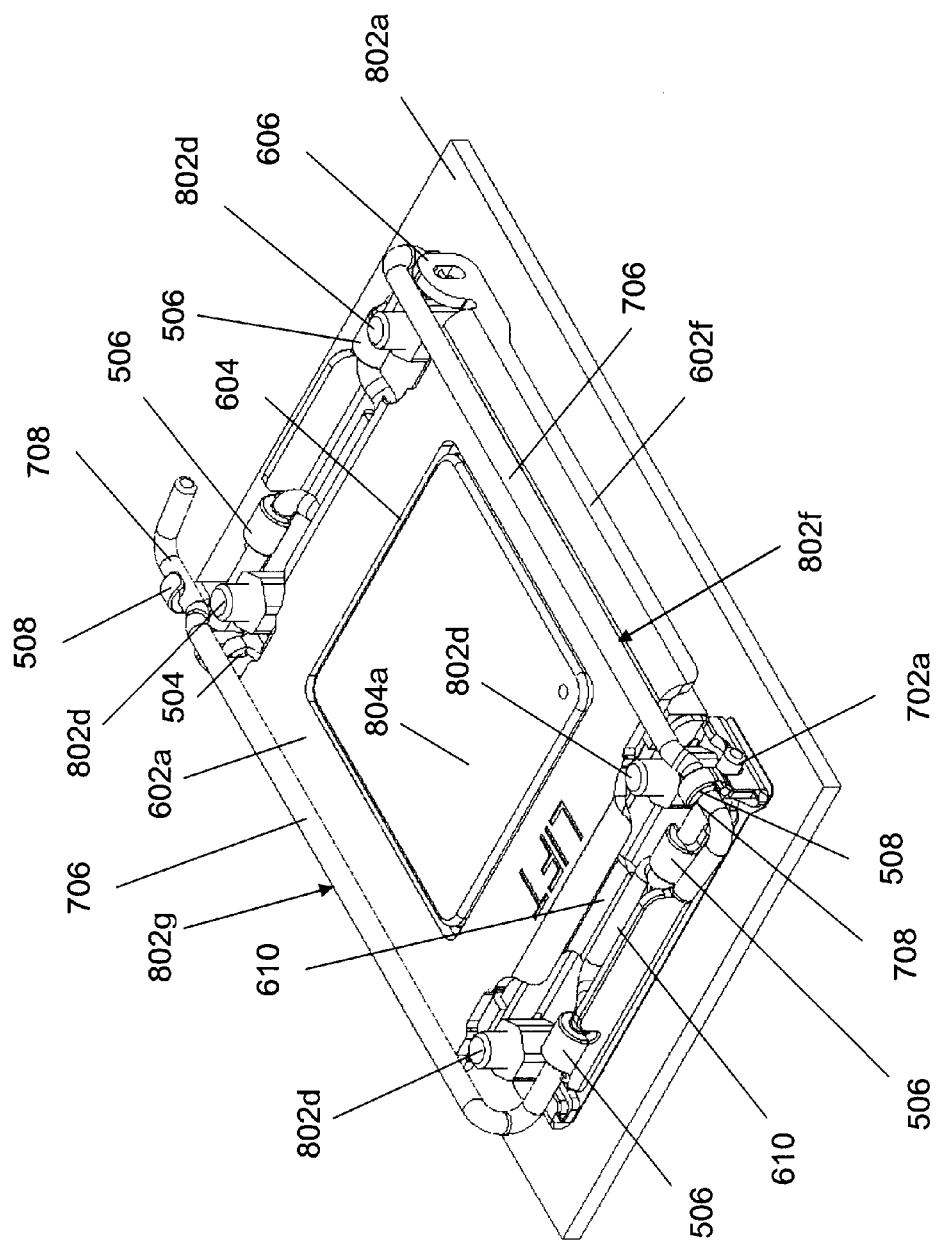
FIG. 8g is a perspective view illustrating an embodiment of the processor of FIGS. 8d and 8e mated with the socket.
Figure 8H:
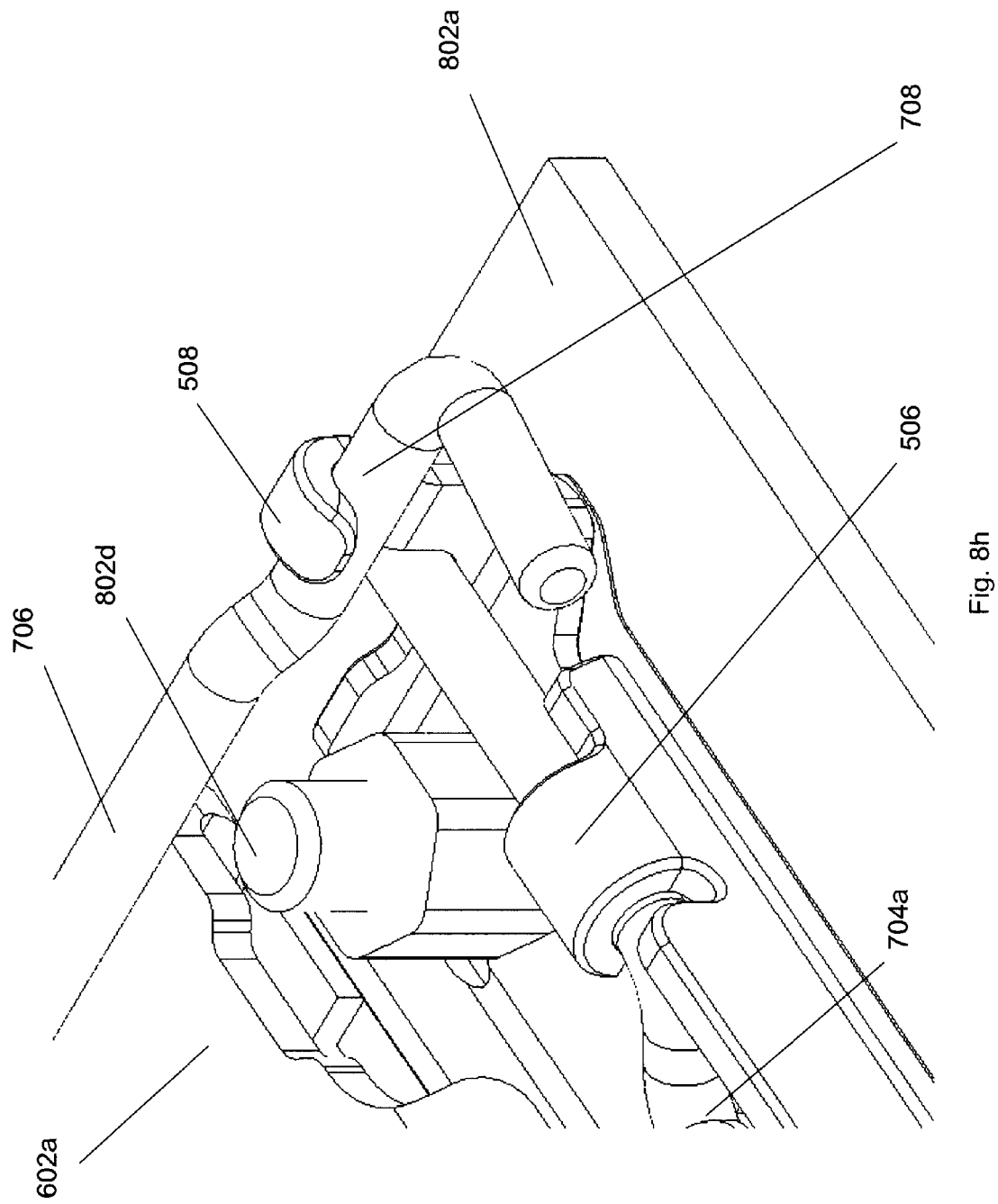
FIG. 8h is a perspective view illustrating an embodiment of the securing member of FIG. 7 secured to the base member of FIGS. 5a and 5b to mate the processor with the socket.

Referring now to FIGS. 5a, 5b, 6a, 6b, 7, 8a, 8d, 8e, and 8f, the method 800 then proceeds to block 804 where a processor is positioned adjacent the socket. A processor 804a, which may be the processor 102 described above with reference to FIG. 1, is provided and positioned adjacent the socket 802e, as illustrated in FIG. 8d. The method 800 then proceeds to block 806 where the loading member is positioned adjacent the second base member. The loading member 602 is rotated about the coupling between the rotational coupling members 504 and the rotational coupling members 606 in a direction A, illustrated in FIG. 8d, such that front edge 602c of the loading member 602 is located adjacent the second base member 802c, illustrated in FIG. 8e. With the loading member 602 located adjacent the second base member 802c, the processor 804 is located in the component aperture 604 and the bottom surface 602b of the loading member 602 engages a portion of the processor 804. In an embodiment, the rotational coupling between the loading member 602 and the first base member 802*b* allows the loading member 502 to move along an axis B. For example, in the embodiment illustrated in FIG. 8*f*, the rotational coupling member 504 includes a peg that fits in a slot defined by the rotational coupling member 606 such that the peg can travel along the axis B in the slot. Such a rotational coupling allows rotation of the loading member 602 relative to the first base member 802*b* without impacting processor loading (discussed below) such that processor loading may be uniform.

Referring now to FIGS. 5*a*, 5*b*, 6*a*, 6*b*, 7, 8*a*, 8*g*, and 8*h*, the method 800 then proceeds to block 808 where the securing members are engaged with the loading member. Each of the first securing member 802*f* and the second securing member 802*g* are moved about their coupling to the securing member couplers 506 on the first base member 802*b* and the second base member 802*c*, respectively, until the primary securing portion 706 engages the top surface 602*a* of the loading member 602 and the secondary securing portions 704*a* engage the secondary securing members 610 and 608, respectively, on the loading member 602. In an embodiment, the primary securing portions 706 of the first securing member 802*f* and the second securing member 802*g* that engage the top surface 602*a* of the loading member 602 do so between the side edges 602*e* and 602*f* of the loading member 602. By positioning the first and second securing members 802*f* and 802*g* within the side edges 602*e* and 602*f* of the loading member 602, other IHS components may be positioned closer to the socket 802*e* than is available with conventional systems. With the primary securing portions 706 and secondary securing portion 704*a* on the first securing member 802*f* and second securing member 802*g* engaging the loading member 602, the securing feature 708 on the first securing member 802*f* may be engaged with the securing member retainer 508 on the second base member 802*c* and the securing feature 708 on the second securing member 802*g* may be engaged with the securing member retainer 508 on the first base member 802*b*, illustrated in FIGS. 8*g* and 8*h*. With the securing features 708 engaged with the securing member retainers 508, each of the first securing member 802*f* and the second securing member 802*g* provides an approximately equal load that is transferred through the loading member 602 to the processor 804 and is sufficient to mate the processor 804 with the socket 802*e*.

Figure 8J:
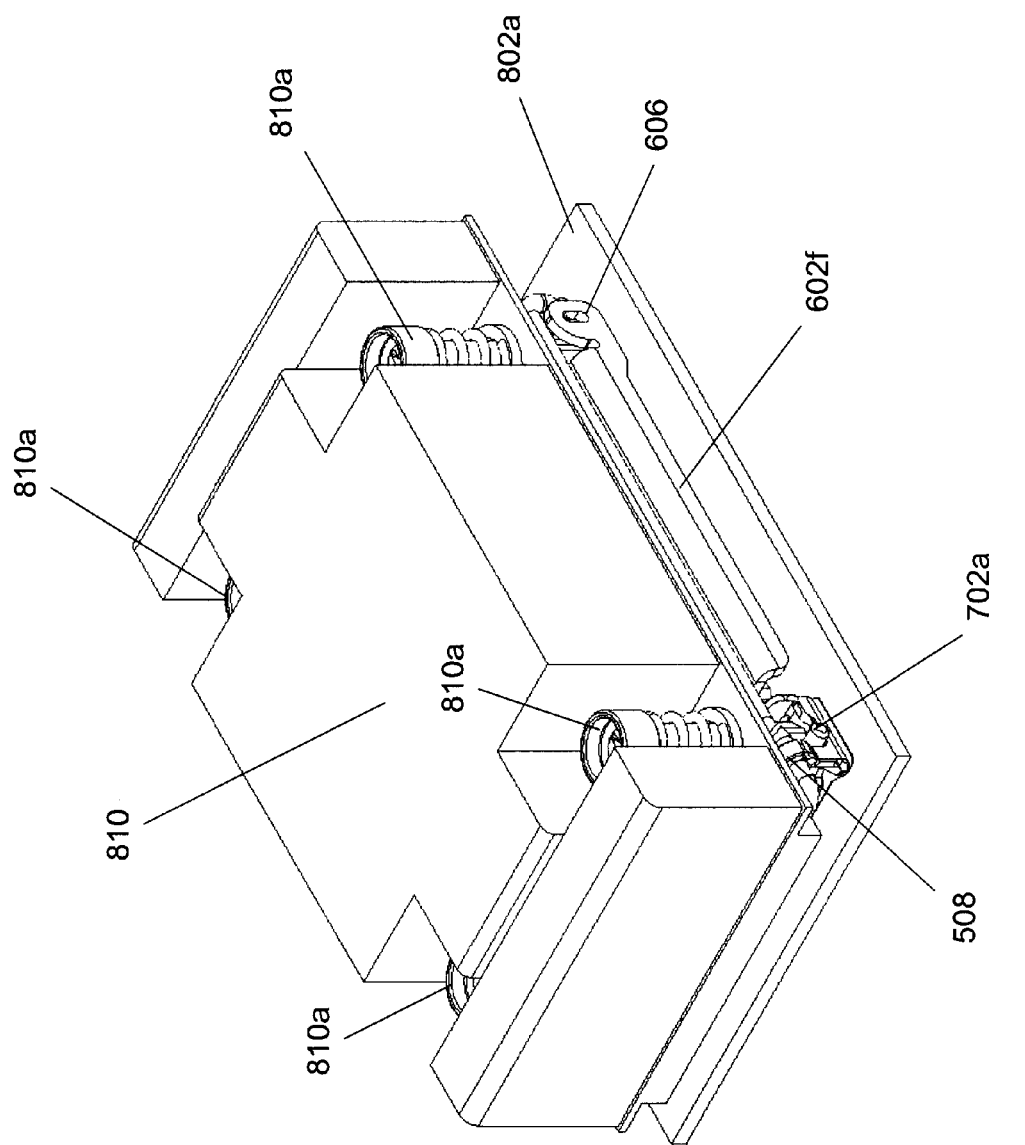
FIG. 8j is a perspective view illustrating an embodiment of the heat dissipater of FIG. 8i secured to the processor of FIG. 8h.

Referring now to FIGS. 5*a*, 5*b*, 6*a*, 6*b*, 7, 8*a*, 8*i*, and 8*j*, the method 800 then proceeds to block 810 where a heat dissipater is coupled to the processor. A heat dissipater 810 which may be, for example, a heat sink and/or other heat dissipating components known in the art, is provided that includes a plurality of coupling members 810*a*. The heat dissipater 810 is positioned adjacent the processor 804 such that the coupling members 810*a* are substantially aligned with respective heat dissipater coupling posts 802*d*, as illustrated in FIG. 8*i*. The heat dissipater 810 is then moved in a direction B such that heat dissipater 810 engages and is thermally coupled to the processor 804 and the coupling members 810*a* engage the heat dissipater coupling posts 802*d* and may be coupled to the heat dissipater coupling posts 802*d* to secure the heat dissipater 810 to the processer 804, as illustrated in FIG. 8*j*. Coupling the heat dissipater 810 to the heat dissipater coupling posts 802*d* eliminates the need for additional holes in the board 802*a* to mount the heat dissipater 810, which allows trace density on the board 802*a* to be increased. Thus, a system and method have been described that limit the obstructions on a board adjacent a socket to two pairs of heat dissipater coupling posts. Limiting obstructions on a board adjacent a socket allow for the provision of, for example, increased trace routing density. The system and method described also provides for coupling a heat dissipater to the processor without creating any additional obstructions on the board adjacent the socket. The system and method provide a pair of levers that may provide equal loading to the processor without extending into the volume adjacent the socket, which allows power components such as, for example, voltage regulators, to be positioned closer to the socket (e.g., immediately adjacent the socket) than is possible with conventional processor loading systems in order to improve power delivery efficiency.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A component loading system, comprising:
 a board comprising a socket;
 a first base member secured to the board through a plurality of first heat dissipater coupling posts, wherein a first securing member is moveably coupled to the first base member;
 a second base member secured to the board through a plurality of second heat dissipater coupling posts, wherein a second securing member is moveably coupled to the second base member;
 a loading member that is moveably coupled to the first base member and includes a pair of opposing side edges that define a width of the loading member; and
 a heat dissipater that is operable to be coupled to the plurality of first heat dissipater coupling posts and the plurality of second heat dissipater coupling posts;
 wherein the loading member is operable to be secured to the board by moving the loading member adjacent the second base member, moving the first securing member into engagement with the second base member and a top surface of the loading member that extends between the side edges, and moving the second securing member into engagement with the first base member and the top surface of the loading member that extends between the side surfaces.

2. The system of claim 1, further comprising:
 a secondary securing member extending from each of a pair of opposing edges of the loading member.

3. The system of claim 2, wherein the first securing member includes a primary securing portion that is operable to engage the top surface of the loading member and a secondary securing portion that is operable to engage a first of the secondary securing members, and wherein the second securing member includes a primary securing portion that is operable to engage the top surface of the loading member and a secondary securing portion that is operable to engage a second of the secondary securing members.

4. The system of claim 1, further comprising:
 a heat producing component coupled to the socket, wherein the loading member is operable to apply a force to the heat producing component sufficient to mate the heat producing component with the socket when the heat producing component is positioned on the socket and the loading member is secured to the board.

5. The system of claim 1, wherein engagement of the first securing member with the top surface of the loading member results in a first load on the loading member, and wherein engagement of the second securing member with the top surface of the loading member results in a second load on the loading member that is approximately equal to the first load.

6. The system of claim 1, wherein the first base member and the second base member are substantially similar in structure and dimensions.

7. The system of claim 1, wherein the loading member is rotatably coupled to the first base member, and wherein the rotatable coupling allows the loading member to move relative to the first base member along at least one axis.

8. The system of claim 1, wherein the entire portion of first securing member and the entire portion of second securing member that engage the top surface of the loading member are located between the pair of opposing side edges.

9. An information handling system, comprising:
a chassis housing a board that comprises a socket;
a memory coupled to the socket; and
a processor coupled to the memory through the socket, wherein the processor is mated to the socket with a processor loading system comprising:
a first base member secured to the board through a plurality of first heat dissipater coupling posts, wherein a first securing member is moveably coupled to the first base member;
a second base member secured to the board through a plurality of second heat dissipater coupling posts, wherein a second securing member is moveably coupled to the second base member;
a loading member that is moveably coupled to the first base member and includes a pair of opposing side edges that define a width of the loading member; and
a heat dissipater that is coupled to the plurality of first heat dissipater coupling posts and the plurality of second heat dissipater coupling posts such that the heat dissipater is thermally coupled to the processor;
wherein the loading member is secured to the board to mate the processor to the socket through the positioning of the loading member adjacent the second base member, engaging the first securing member with the second base member and a top surface of the loading member that extends between the side edges, and engaging the second securing member with the first base member and the top surface of the loading member that extends between the side surfaces.

10. The system of claim 9, further comprising:
a secondary securing member extending from each of a pair of opposing edges of the loading member.

11. The system of claim 10, wherein the first securing member includes a primary securing portion that engages the top surface of the loading member and a secondary securing portion that engages a first of the secondary securing members, and wherein the second securing member includes a primary securing portion that engages the top surface of the loading member and a secondary securing portion that engages a second of the secondary securing members.

12. The system of claim 9, wherein engagement of the first securing member with the top surface of the loading member results in a first load on the loading member, and wherein engagement of the second securing member with the top surface of the loading member results in a second load on the loading member that is approximately equal to the first load.

13. The system of claim 9, wherein the first base member and the second base member are substantially similar in structure and dimensions.

14. The system of claim 9, wherein the loading member is rotatably coupled to the first base member, and wherein the rotatable coupling allows the loading member to move relative to the first base member along at least one axis.

15. The system of claim 9, wherein the entire portion of first securing member and the entire portion of second securing member that engage the top surface of the loading member are located between the pair of opposing side edges.

16. A method for coupling a processor to a socket, comprising:
providing a board that comprises a socket and includes a first base member secured to the board through a plurality of first heat dissipater coupling posts and a second base member secured to the board through a plurality of second heat dissipater coupling posts, wherein a first securing member is moveably coupled to the first base member and a second securing member is moveably coupled to the second base member;
positioning a processor adjacent the socket;
coupling a loading member to the first base member and positioning the loading member adjacent the second base member;
mating the processor with the socket by engaging the first securing member with the second base member and a top surface of the loading member that extends between a pair of loading member side edges that define a width of the loading member, and engaging the second securing member with the first base member and the top surface of the loading member that extends between the pair of side edges; and
coupling a heat dissipater to the plurality of first heat dissipater coupling posts and the plurality of second heat dissipater coupling posts such that the heat dissipater is thermally coupled to the processor.

17. The method of claim 16, wherein coupling the loading member to the first base member comprises moveably coupling the loading member to the first base member.

18. The method of claim 16, wherein the mating the processor with the socket further comprises:
engaging a primary securing portion of the first securing member with the top surface of the loading member and a secondary securing portion of the first securing member with a first secondary securing member that extends from the loading member; and
engaging a primary securing portion of the second securing member with the top surface of the loading member and a secondary securing portion of the second securing member with a second secondary securing member that extends from the loading member.

19. The method of claim 16, wherein engagement of the first securing member with the top surface of the loading member results in a first load on the loading member, and wherein engagement of the second securing member with the top surface of the loading member results in a second load on the loading member that is approximately equal to the first load.

20. The method of claim 16, wherein the entire portion of first securing member and the entire portion of second securing member that engage the top surface of the loading member are located between the pair of side edges.

* * * * *